(12) United States Patent
Iba

(10) Patent No.: US 7,378,352 B2
(45) Date of Patent: May 27, 2008

(54) METHOD OF FABRICATING SEMICONDUCTOR DEVICE

(75) Inventor: Yoshihisa Iba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/411,043

(22) Filed: Apr. 26, 2006

(65) Prior Publication Data
US 2007/0167020 A1   Jul. 19, 2007

(30) Foreign Application Priority Data
Jan. 13, 2006   (JP) ............................. 2006-005851

(51) Int. Cl.
*H01L 21/302*   (2006.01)
(52) U.S. Cl. ...................... 438/714; 438/706; 438/710; 438/720
(58) Field of Classification Search ................ 438/706, 438/710, 714, 720, 723
See application file for complete search history.

(56) References Cited

U.S. PATENT DOCUMENTS 6,231,777 B1 *   5/2001   Kofuji et al. .................. 216/71

2003/0054656 A1 *   3/2003   Soda .......................... 438/710

FOREIGN PATENT DOCUMENTS

| JP | 10-284600 | 10/1998 |
| JP | 2000-183040 | 6/2000 |
| JP | 2003-7981 | 1/2003 |
| JP | 2004-119950 | 4/2004 |

* cited by examiner

*Primary Examiner*—Lan Vinh
(74) *Attorney, Agent, or Firm*—Westernman, Hattori, Daniels & Adrian, LLP.

(57) ABSTRACT

After low dielectric constant films are formed on a wiring, hardmasks are formed on the low dielectric constant films. A resistmask is formed on the hardmasks. Via holes are formed in the low dielectric constant films using the resistmask. Ashing the resistmask is performed. During this process, a protection film is formed by sticking a sputtered material generated from the resistmask at least onto side surfaces of the via holes. Thereafter, the via holes are extended to the wiring, and a conductive material is buried into the via holes.

17 Claims, 28 Drawing Sheets

METHOD OF FABRICATING SEMICONDUCTOR DEVICE

CROSS-REFERENCE TO RELATED APPLICATIONS

This application is based upon and claims the benefit of priority from the prior Japanese Patent Application No. 2006-005851, filed on Jan. 13, 2006, the entire contents of which are incorporated herein by reference.

BACKGROUND OF THE INVENTION

1. Field of the Invention

The present invention relates to a method of fabricating a semiconductor device preferable for forming wiring layers.

2. Description of the Related Art

A damascene method is known as a method of forming Cu wirings. FIGS. 12A to 12J are cross sectional views showing a conventional method of fabricating a semiconductor device in the order of processing.

In the conventional method, as shown in FIG. 12A, a low dielectric constant film 101 and a SiC film 103 are formed on an interlayer insulating film and the like, and wiring trenches are formed in the low dielectric constant film 101 and the SiC film 103. And, wirings 102 are buried in the wiring trenches.

Next, a stopper film 104 and a low dielectric constant film 105 are formed on the wirings 102 and the SiC film 103. As the stopper film 104, a SiCH film is formed, for example. As the low dielectric constant film 105, a SiOCH film is formed, for example.

Next, a low dielectric constant film 106 is formed on the low dielectric constant film 105 by a coating method. As the low dielectric constant film 106, a porous silica film (NCS (Nano Clustering Silica) film, for example) is formed, for example.

Thereafter, a hardmask 107, a hardmask 108, and a hardmask 109 are formed in this order on the low dielectric constant film 106. As the hardmask 107, a SiCH film is formed, for example. As the hardmask 108, a SiO$_2$ film is formed, for example. As the hardmask 109, a SiC film is formed, for example.

Next, as shown in FIG. 12B, a resistmask 110 having a pattern with via holes is formed on the hardmask 109.

Next, as shown in FIG. 12C, via holes 111 which extend to the middle of the low dielectric constant film 105 are formed in the hardmask 109, the hardmask 108, the hardmask 107, the low dielectric constant film 106 and the low dielectric constant film 105 using the resistmask 110 as a mask.

Next, as shown in FIG. 12D, the resistmask 110 is removed by ashing. Thereafter, residues are removed by performing wet process.

Next, by burying resin material into the via holes 111, and by etching back it using O$_2$ plasma, as shown in FIG. 12E, resin films 113 are formed in the via holes 111, and its surface is flattened. Next, an anti-reflection film 114 and a resistmask 115 having a pattern of wirings are formed in this order over the whole surface.

Next, as shown in FIG. 12F, patterning of the anti-reflection film 114 and the hardmask 109 is performed using the resistmask 115 as a mask. At this time, the upper surface of the resin film 113 goes down.

Thereafter, as shown in FIG. 12G, the resistmask 115 and the anti-reflection film 114 are perfectly removed by ashing.

Next, as shown in FIG. 12H, patterning of the hardmask 108 and the hardmask 107 is performed using the hardmask 119 as a mask, and the via holes 111 are extended to the stopper film 104. As a result, the hardmask 109 vanishes.

Next, as shown in FIG. 12I, by patterning the low dielectric constant film 106 using the hardmask 108 and the hardmask 107 as a mask, wiring trenches 117 are formed and at the same time, the via holes 111 are extended to the wirings 102.

Thereafter, a barrier metal film and a Cu-seed layer (not shown) are formed on the whole surface, on which a Cu-film is formed by an electroplating. Then, CMP of the Cu-film, the Cu-seed layer, the barrier metal film, and the hardmask 108 is performed until the hardmask 107 is exposed. As a result, as shown in FIGS. 12J and 13, a structure in which vias 118a are buried in the via holes 111, and wirings 118b are buried in the wiring trenches 117 is obtained. FIG. 13 is the cross sectional view of FIG. 12J taken along the line III-III.

Conventionally, the Cu wirings are formed by this method, however, withstand voltage between adjacent vias 118a is not sufficient.

Note that forming an inorganic protection film on the side wall of the via holes by CVD method is disclosed in the patent documents 1 and 2, however, forming the inorganic protection film increases the number of the processes, thereby increasing the process time and the cost.

In the patent document 3, forming a protection film after forming the via holes by inversely sputtering a base film is disclosed, however, forming the protection film increases the number of the process, thereby increasing the process time and the cost.

In the patent document 4, adjusting an atmosphere during ashing a resistmask used for forming contact holes which extend to electrodes of a ferroelectric capacitor is disclosed. However, it is not the technologies relating to a part where a problem of a withstand voltage occurs, and it is impossible to suppress the reduction in the withstand voltage through these adjusting.

Related arts are disclosed in:

patent document 1 (Japanese Patent Application Laid-open No. 2004-119950), patent document 2 (Japanese Patent Application Laid-open No.Hei 10-284600), patent document 3 (Japanese Patent Application Laid-open No. 2000-183040), and patent document 4 (Japanese Patent Application Laid-open No. 2003-7981).

SUMMARY OF THE INVENTION

The present invention has an object to provide a method of fabricating a semiconductor device, which can suppress a reduction in a withstand voltage between vias while suppressing an increase in the number of processes.

With several investigations to diagnose a cause of the reduction in the withstand voltage, the inventor of the present application has found that one of the causes is the low dielectric constant film 106 suffering from damages many times before forming the wirings 118b as follows:

(a) The low dielectric constant film 106 suffers from an etching damage when forming the via holes 111 (refer to FIG. 12C).

(b) The low dielectric constant film 106 suffers from an ashing damage when removing the resistmask 110 (refer to FIG. 12D).

(c) The low dielectric constant film 106 suffers from a burying damage when forming the resin film 113 (refer to FIG. 12E).

(d) The low dielectric constant film 106 suffers from an ashing damage when removing the resistmask 115 and the anti-reflecting film 114 (refer to FIG. 12G).

(e) The low dielectric constant film 106 suffers from an etching damage when patterning the hardmasks 108 and 107 (refer to FIG. 12H).

(f) The low dielectric constant film 106 suffers from an etching damage when forming the wiring trenches 117 (refer to FIG. 12I).

Thus, because the low dielectric constant film 106 suffers from the damages many times, the withstand voltage decreases.

With further elaborate investigations based on these view points, the inventor of the present application got inspirations to several embodiments of the invention, as follows.

In a first method of fabricating a semiconductor device according to the present invention, after an inorganic low dielectric constant film is formed over a wiring, a hardmask is formed over the inorganic low dielectric constant film. Next, a resistmask is formed over the hardmask. Then, an opening is formed in the inorganic low dielectric constant film using the resistmask. Thereafter, ashing the resistmask is performed. Next, the opening is extended to the wiring. Then, a conductive material is buried in the opening. When ashing the resistmask is performed, a protection film is formed by sticking a sputtered material generated from the resistmask at least onto the side surface of the opening.

In a second method of fabricating a semiconductor device according to the present invention, after an inorganic low dielectric constant film is formed over a wiring, a hardmask is formed over the inorganic low dielectric constant film. Next, a resistmask is formed over the hardmask. Then, an opening is formed in the inorganic low dielectric constant film using the resistmask. Thereafter, ashing the resistmask is performed. Next, while performing over-ashing the resistmask, by sputter-etching the hardmask, a protection film is formed by sticking a sputtered material generated from the hardmask at least onto a side surface of the opening. Next, the opening is extended to the wiring. Then a conductive material is buried in the opening.

In a third method of fabricating a semiconductor device according to the present invention, after an inorganic low dielectric constant film is formed over a wiring, a hardmask is formed over the inorganic low dielectric constant film. Next, a first resistmask is formed over the hardmask. Then, a first opening is formed in the inorganic low dielectric constant film using the first resistmask. Thereafter, ashing the first resistmask is performed. Next, a second resistmask is formed over the hardmask. Next, patterning the hardmask is performed using the second resistmask. Then, ashing the second resistmask is performed. Thereafter, a second opening is formed in the inorganic low dielectric constant film using the hardmask. Next, the first opening is extended to the wiring. Then a conductive material is buried in the first and the second openings. When ashing the second resistmask is performed, a protection film is formed by sticking a sputtered material generated from the second resistmask at least onto a side surface of the opening.

DETAILED DESCRIPTION OF THE PREFERRED EMBODIMENTS

Figure 1A:
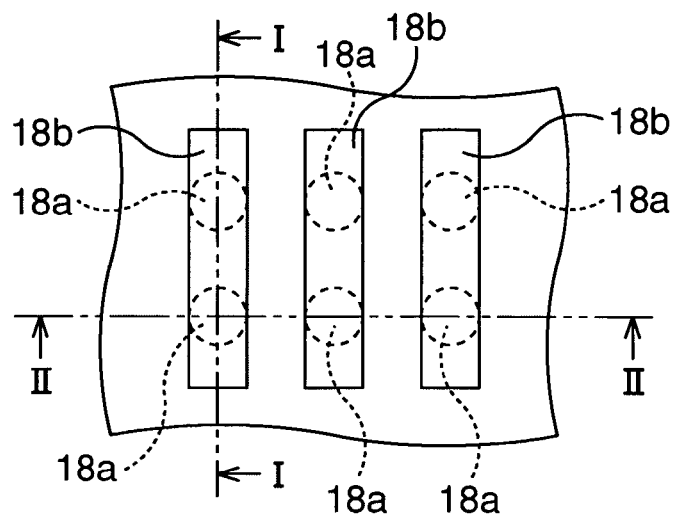
FIG. 1A is a plan view showing a part of a semiconductor device fabricated by an embodiment of the present invention.
Figure 1B:
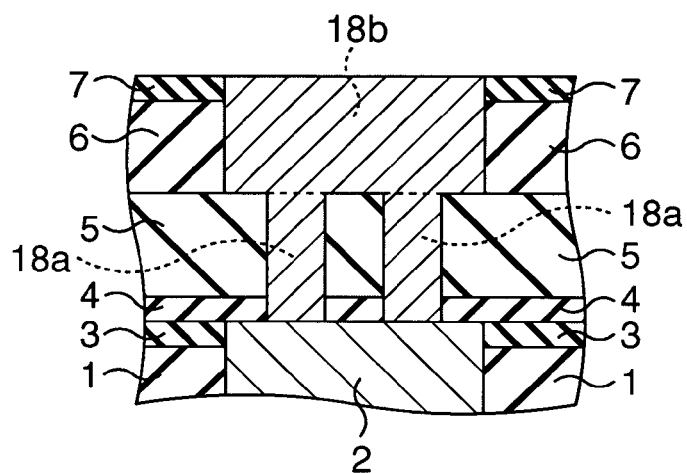
FIG. 1B is a cross section view of FIG. 1A taken along the line I-I.
Figure 1C:
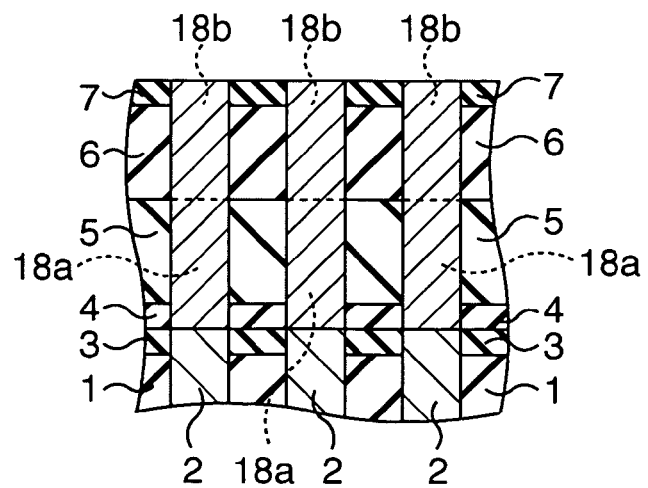
FIG. 1C is a cross section view of FIG. 1A taken along the line II-II.

Embodiments of the present invention will be concretely described with reference to drawings accompanied therewith. FIG. 1A is a plan view showing a part of a semiconductor device fabricated by the embodiment of the present invention. FIG. 1B is a cross section view of FIG. 1A taken along a line I-I. FIG. 1C is a cross section view of FIG. 1A taken along a line II-II.

In this semiconductor device, elements such as transistors (not shown) are formed on a semiconductor substrate (not shown), and a low dielectric constant film 1 is formed thereon as an interlayer insulating film. Also, a SiC film 3 is formed on the low dielectric constant film 1. Then, wiring trenches are formed in the low dielectric constant film 1 and the SiC film 3, wirings 2 connected to the elements are buried in the wiring trenches. The wirings 2 are formed by a damascene method, and the SiC film 3 is used then as a hardmask.

A stopper film 4, a low dielectric constant film 5, a low dielectric constant film 6, and a hardmask 7 are formed on the SiC film 3. Via holes extending to the wirings 2 are formed in the stopper film 4 and the low dielectric constant film 5, and vias 18a are buried therein. Also, wirings 18b being connected to the vias 18a are formed in the low dielectric constant film 6 and the hardmask 7.

Next, a method of fabricating a semiconductor device having a part shown in FIGS. 1A to 1C will be described. FIGS. 2A to 2K are cross sectional views showing the method of fabricating a semiconductor device in the order of processes according to the present invention, and showing the same position of the cross sectional view of FIG. 1B.

FIGS. 3A to 3K are cross sectional views showing the method of fabricating a semiconductor device in the order of processes according to the present invention, and showing the same position of the cross sectional view of FIG. 1C.

Figure 2A:
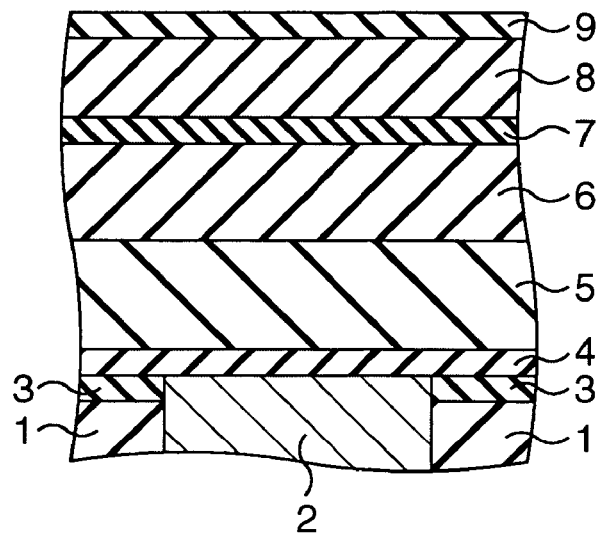
FIGS. 2A to 2K are cross sectional views showing a method of fabricating a semiconductor device in the order of processes according to the present invention.
Figure 3A:
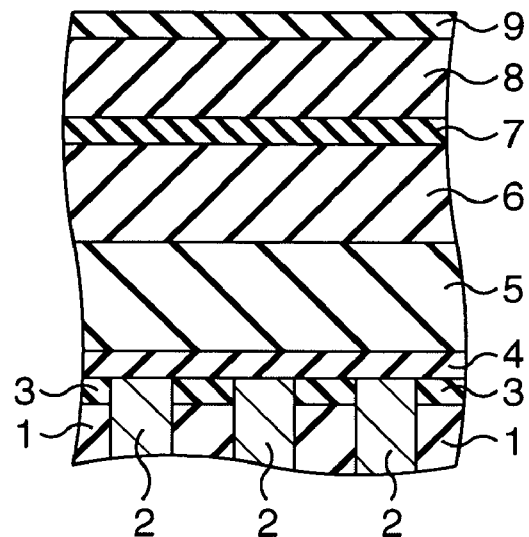
FIGS. 3A to 3K are cross sectional views showing a method of fabricating a semiconductor device in the order of processes according to the present invention, as in the case of FIGS. 2A to 2K.

In the embodiment, first, after elements such as transistors are formed on a surface of a semiconductor substrate (not shown), on which an interlayer insulating film (not shown) is formed, and contact plugs are formed in the interlayer insulating film. Further, as shown in FIGS. 2A and 3A, a low dielectric constant film 1 and a SiC film 3 are formed on the interlayer insulating film, and wiring trenches are formed in the low dielectric constant film 1 and the SiC film 3. Then, wirings 2 are buried in the wiring trenches.

Next, a stopper film 4 and a low dielectric constant film 5 are formed on the wirings 2 and the SiC film 3 by a plasma CVD method. As the stopper film 4, a SiCH film having a thickness of about 50 nm is formed, for example. As the low dielectric constant film 5, a SiOCH film having a thickness of about 160 nm is formed, for example.

Next, a low dielectric constant film 6 is formed on the low dielectric constant film 5 by a coating method or a CVD method. As the low dielectric constant film 6, a porous silica film (for example, NCS film (Nano Clustering Silica) film) having a thickness of about 140 nm is formed, for example.

Thereafter, a first hardmask 7, a second hardmask 8, and a third hardmask 9 are formed on the low dielectric constant film 6 in this order by a plasma CVD method. As the first hardmask 7, a SiCH film having a thickness of about 50 nm is formed, for example. As the second hardmask 8, a SiO$_2$ film having about a thickness of about 100 nm is formed, for example. As the third hardmask 9, a SiC film having a thickness of about 70 nm is formed, for example.

Figure 2B:
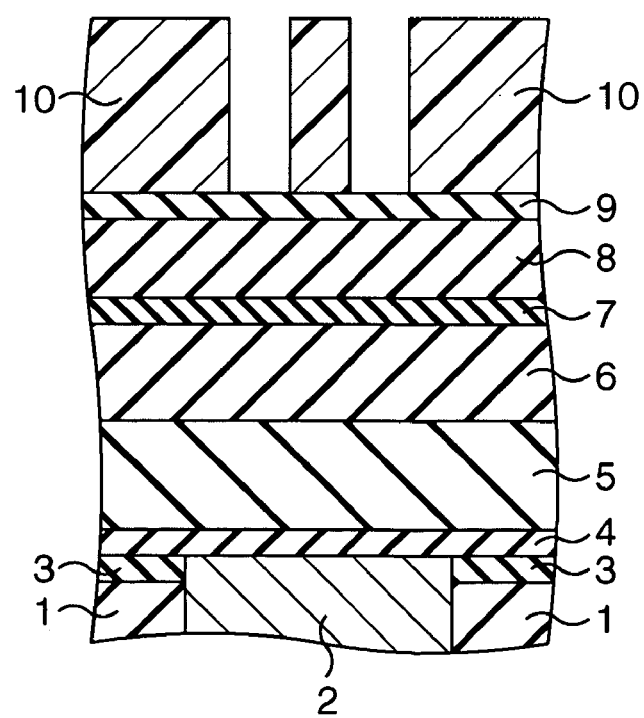
Figure 3B:
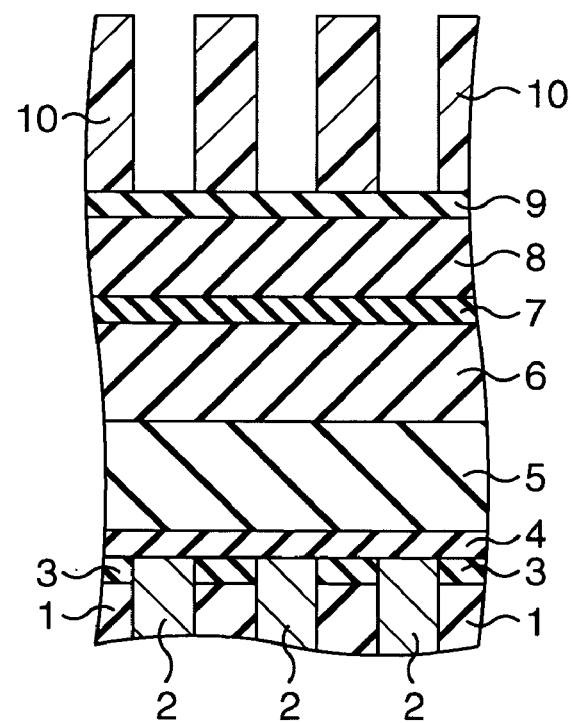

Next, as shown in FIGS. 2B and 3B, a resistmask 10 having a pattern of via holes each of which has about 100 nm in diameter is formed on the third hardmask 9. The thickness of the resistmask 10, is about 300 nm, for example. When forming the resistmask 10, an ArF resist, for example, is coated, and then exposure and developing may be performed thereon.

Figure 2C:
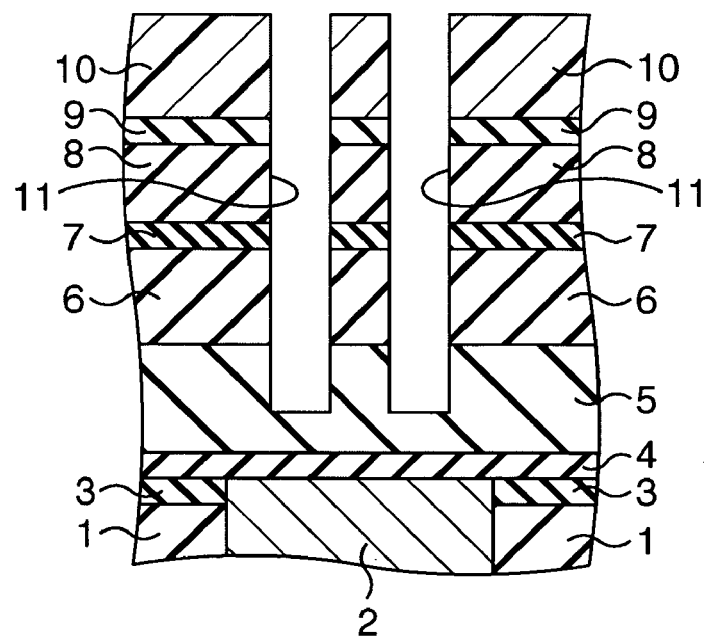
Figure 3C:
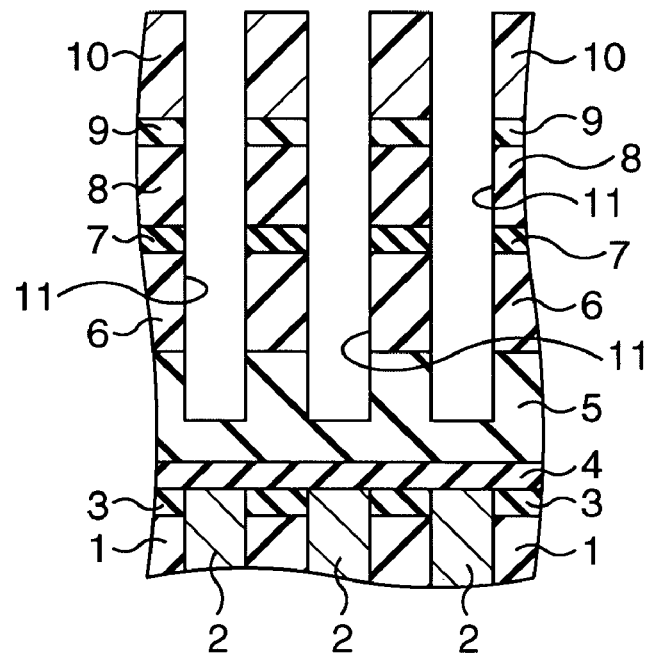

Next, as shown in FIGS. 2C and 3C, using the resistmask 10 as a mask, via holes 11 are formed in the third hardmask 9, the second hardmask 8, the first hardmask 7, the low dielectric constant film 6, and the low dielectric constant film 5, extending to the middle of the low dielectric constant film 5.

Figure 2D:
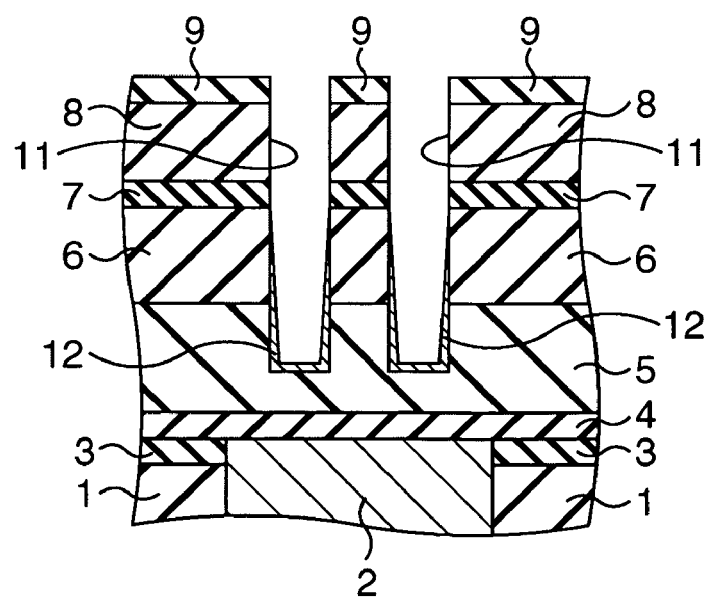
Figure 3D:
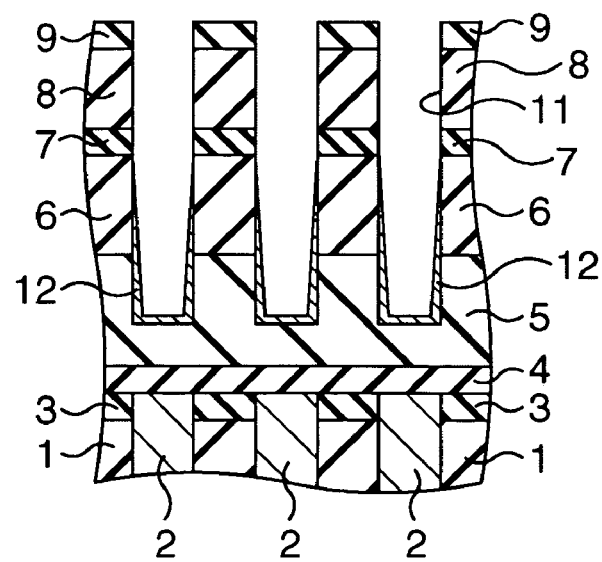

Next, as shown in FIGS. 2D and 3D, the resistmask 10 is removed by a low pressure ashing. Conditions in this process, for example, are assumed to be flow rate of O$_2$: 100 sccm, pressure in the chamber: 2.67 Pa (20 mTorr), power: 200 W, time duration: 60 seconds, substrate voltage: −400 V. This is followed by an over-ashing of the same time duration (60 sec.) performed under the high pressure. As a result, a part of the resistmask 10 is sputter-etched, and a protection film 12 whose main component is carbon included in the resistmask 10 sticks onto the bottom and side surfaces of the via holes 11. The thickness of the protection film 12 becomes about 3 nm, for example. As the plasma under the low pressure ashing, an ammonia plasma or a hydrogen plasma may be used instead of the oxygen plasma.

Figure 2E:
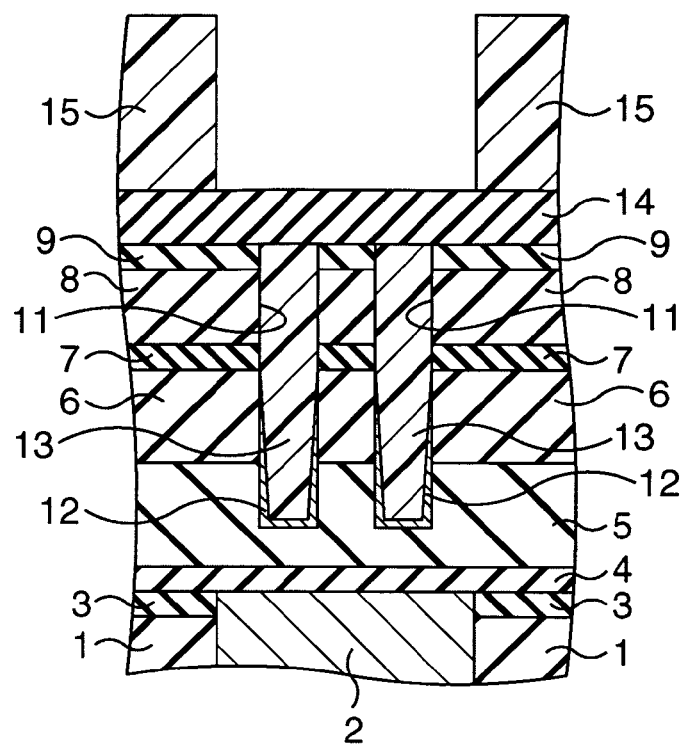
Figure 3E:
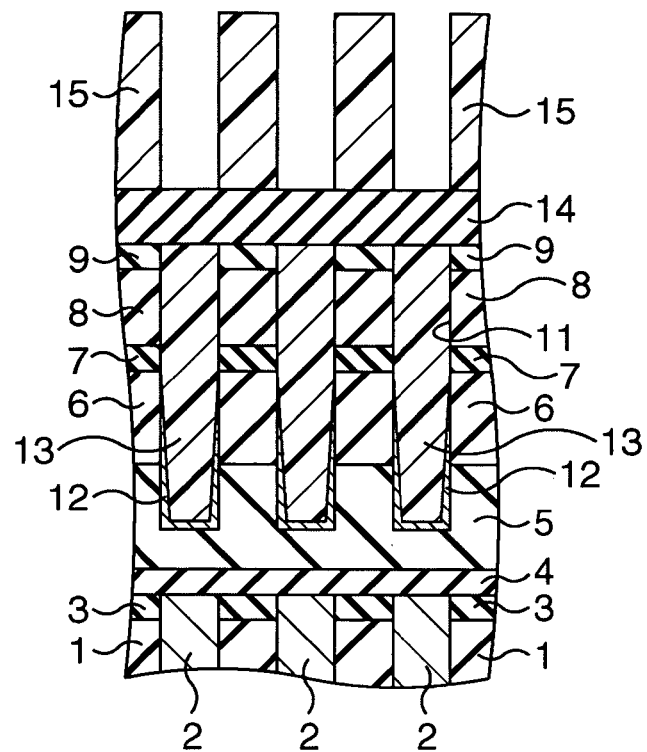

Thereafter, the residue is removed by performing a wet process. Subsequently, by burying resin material in the via holes 11, and by performing etch-back the resin material by using an O$_2$ plasma, as shown in FIGS. 2E and 3E, a resin film 13 is formed in the via holes 11, and its surface is flattened. Next, an anti-reflection film 14 and a resistmask 15 having a pattern of wirings are formed in this order on the whole surface. As the anti-reflection film 14, a BARC (Bottom Anti Reflection Coating) having a thickness of about 50 nm is formed by a coating method, for example. The thickness of the resistmask 15 is about 300 nm, for example. When forming the resistmask 15, an ArF resist is coated, for example, and thereafter, exposure and developing may be performed thereon.

Figure 2F:
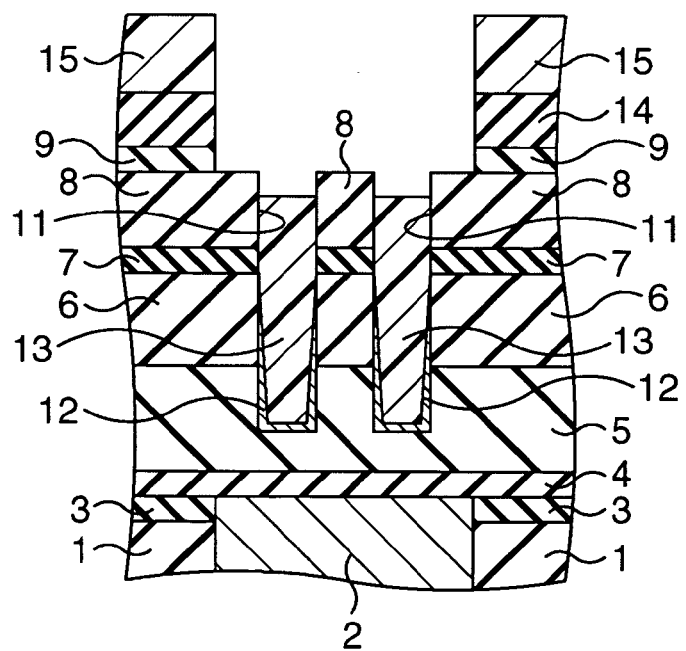
Figure 3F:
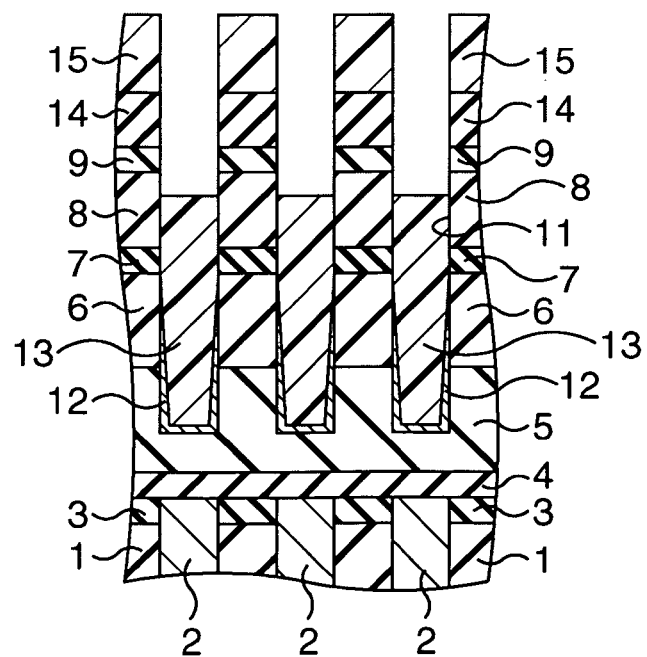

Next, as shown in FIGS. 2F and 3F, patterning of the anti-reflection film 14 and the third hardmask 9 is performed using the resistmask 15 as a mask. During this process, the upper surface of the resin film 13 goes down.

Figure 2G:
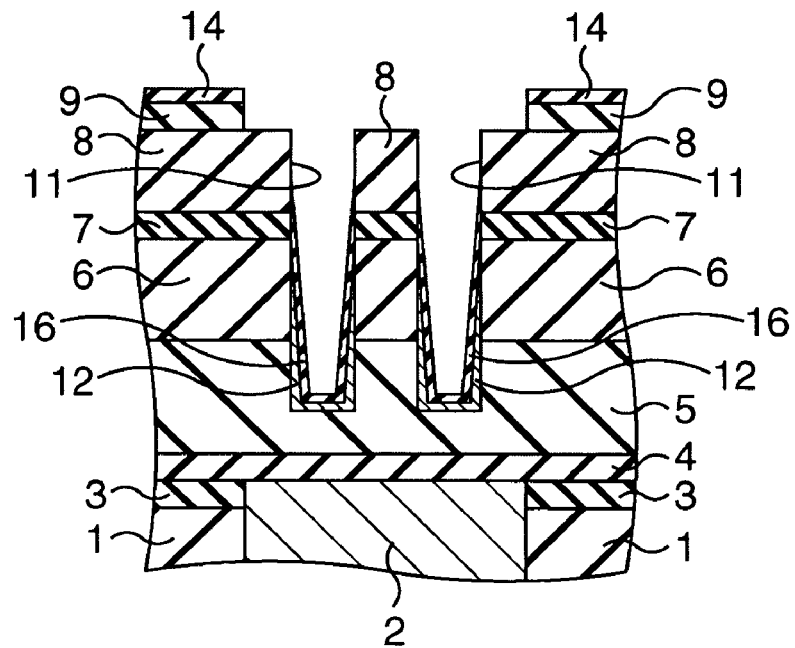
Figure 3G:
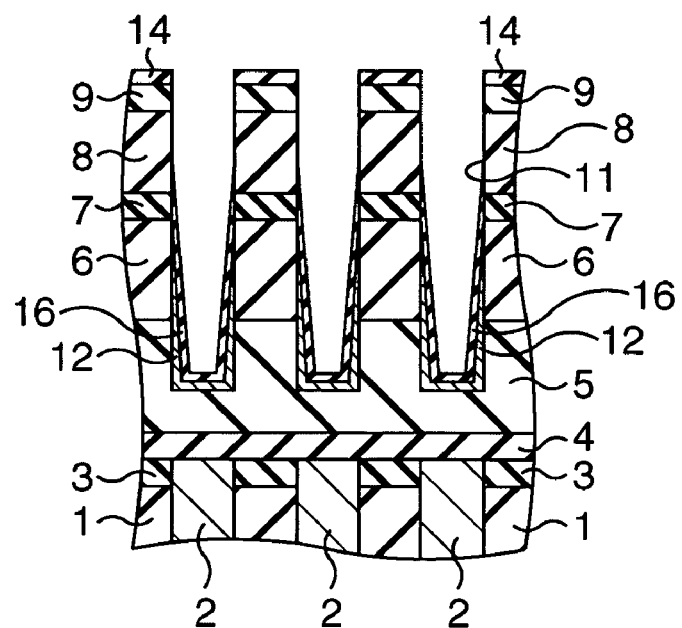

Thereafter, as shown in FIGS. 2G and 3G, the resistmask 15 is perfectly removed by a low pressure ashing, and the anti-reflection film 14 is removed to the middle. Conditions in this process, for example, are assumed to be flow rate of O$_2$: 100 sccm, pressure in the chamber: 2.67 Pa (20 mTorr), power: 200 W, time duration: 60 seconds, and substrate voltage: −400 V. As a result, a part of the resistmask 15 is sputter-etched, so that a protection film 16 whose main component is carbon included in the resistmask 15 sticks onto the protection film 12. The thickness of the protection film 16 becomes about 3 nm, for example.

Figure 2H:
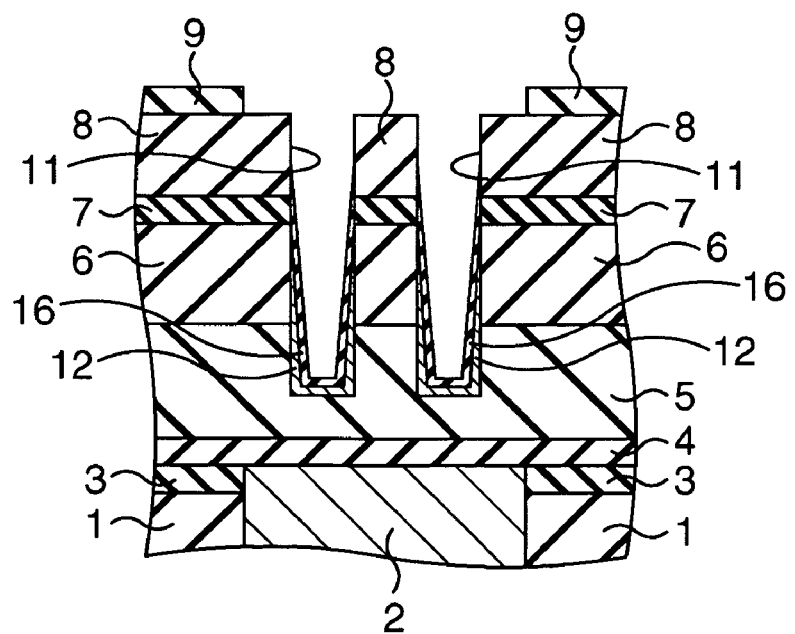
Figure 3H:
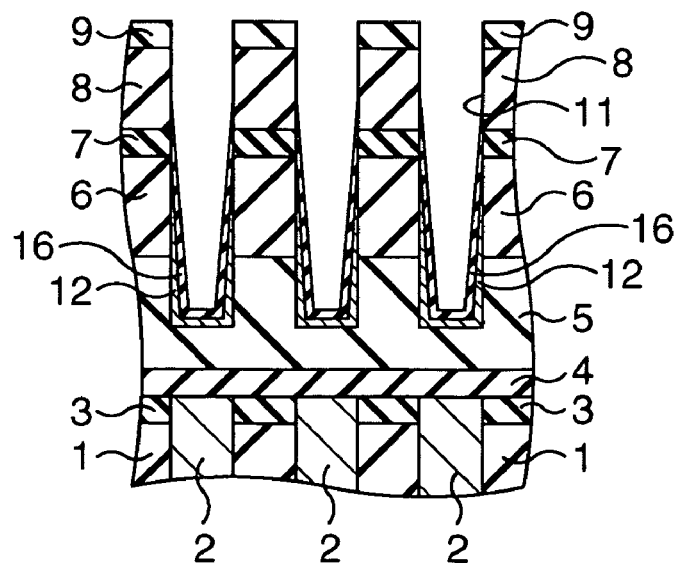

Subsequently, as shown in FIGS. 2H and 3H, the anti-reflection film 14 is perfectly removed by a high pressure ashing. Conditions in this process are assumed to be flow rate of O$_2$: 100 sccm, pressure in the chamber: 13.3 Pa (100 mTorr), power: 150 W, time duration: 60 seconds, and substrate voltage: −250 V, for example.

Figure 2I:
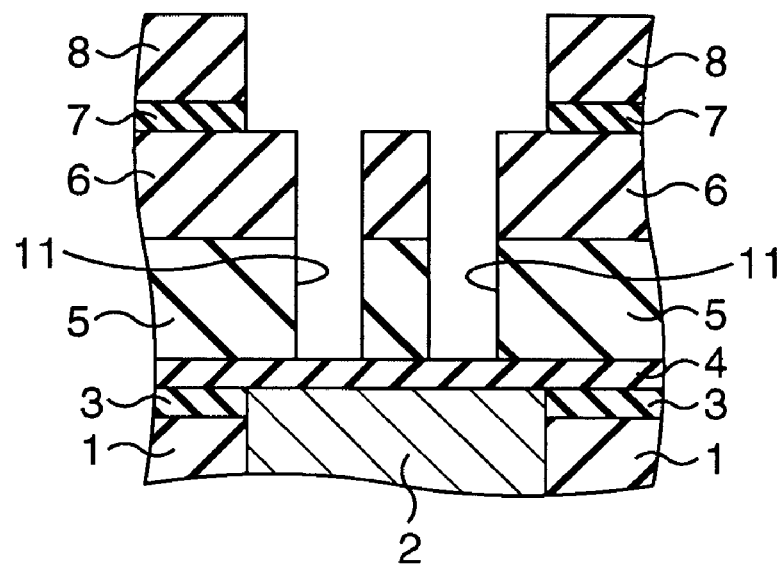
Figure 3I:
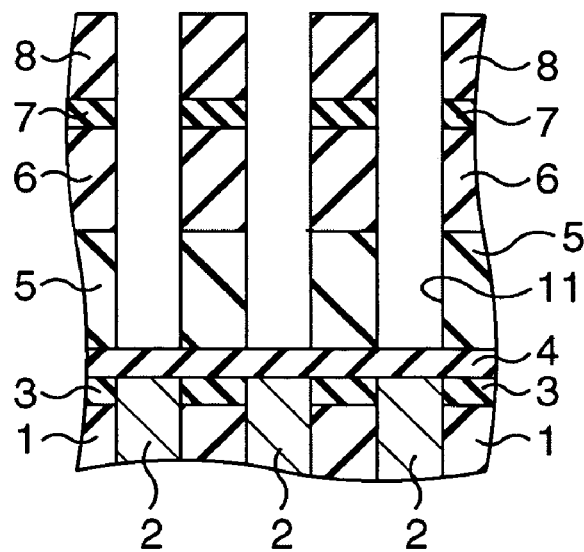

Next, as shown in FIGS. 2I and 3I, patterning of the second hardmask 8 and the first hardmask 7 is performed using the third hardmask 9 as a mask, and via holes 11 are extended to the stopper film 4. As a result, the third hardmask 9 vanishes.

Figure 2J:
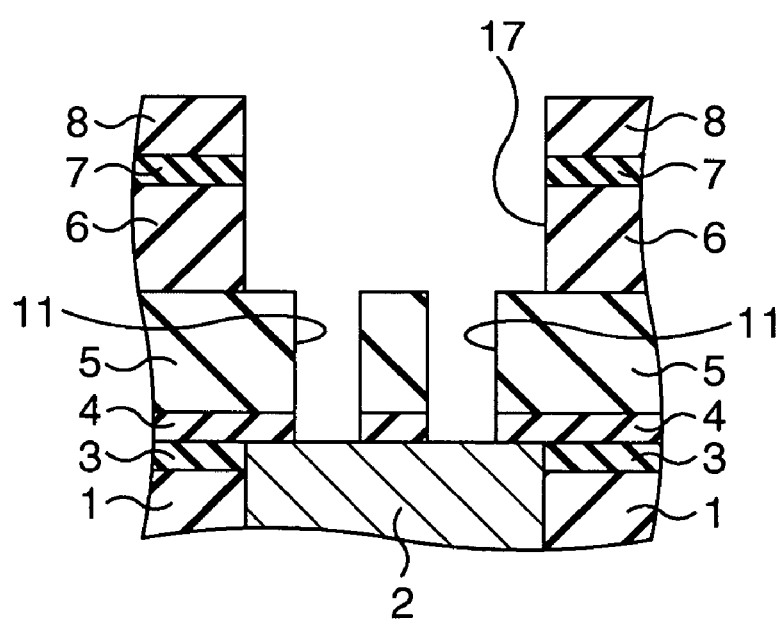
Figure 3J:
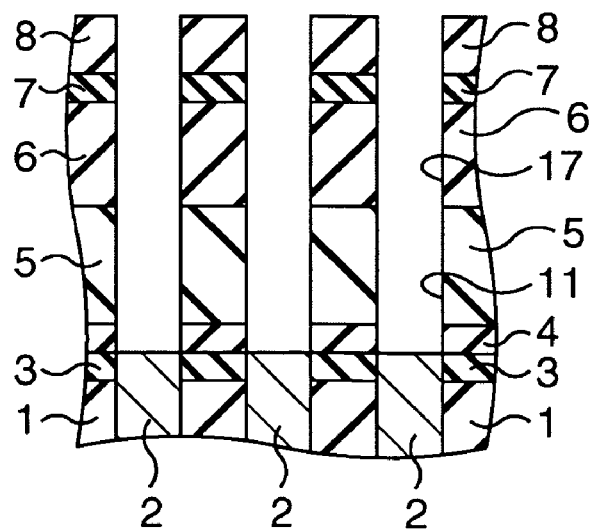

Next, as shown in FIGS. 2J and 3J, patterning of the low dielectric constant film 6 is performed using the second hardmask 8 and the first hardmask 7 as a mask, so that wiring trenches 17 are formed, and via holes 11 are extended to the wirings 2. Conditions in this process are assumed to be flow rate of CF$_4$: 100 sccm, flow rate of CHF$_3$: 50 sccm, pressure in the chamber: 26.6 Pa (200 mTorr), power: 500 W, for example.

Figure 2K:
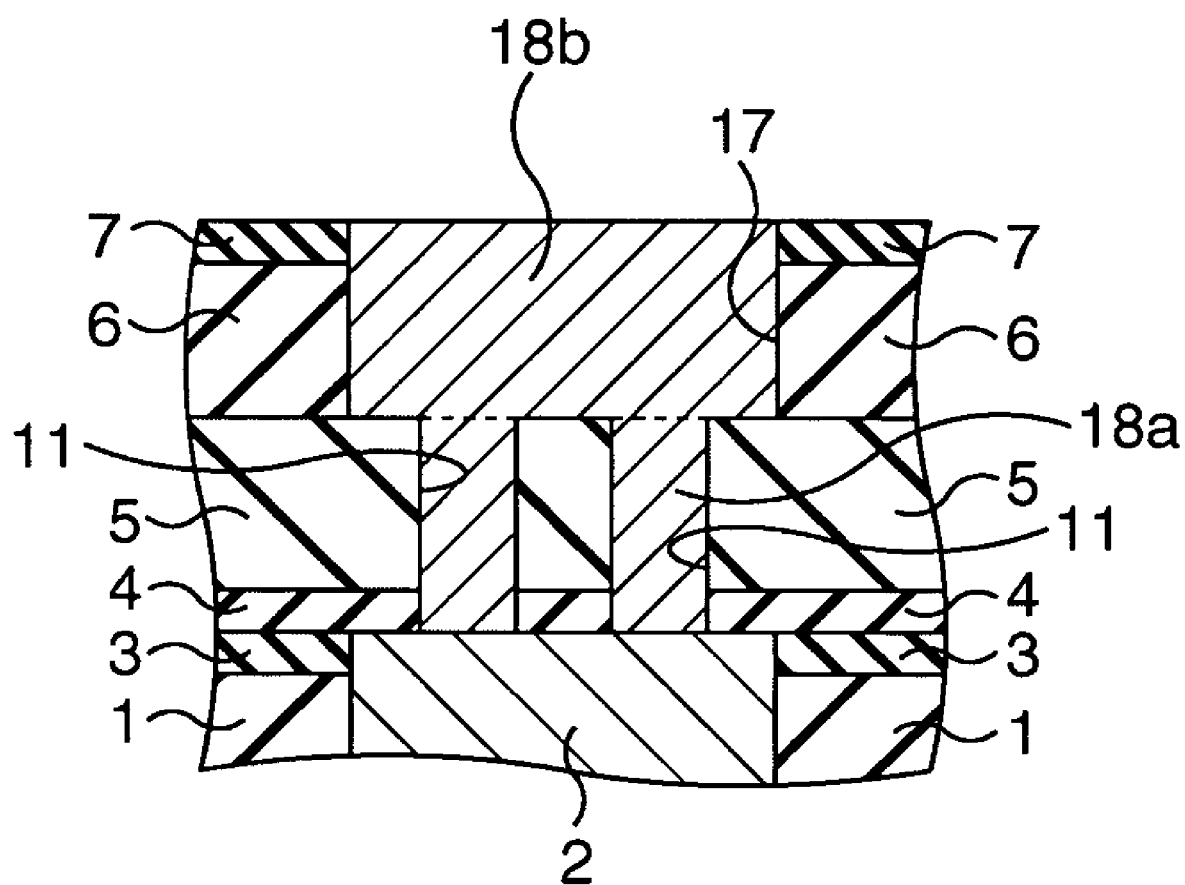
Figure 3K:
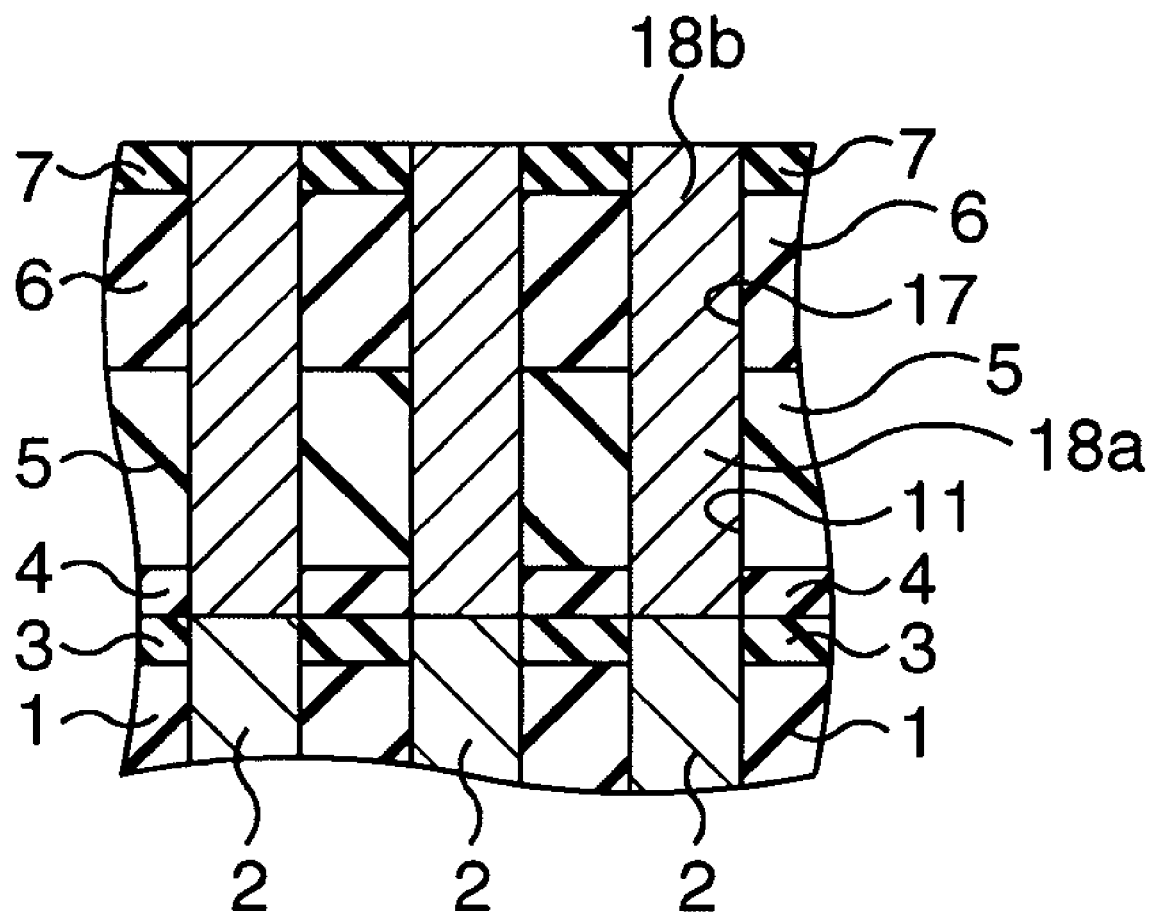

Thereafter, a barrier metal film and a Cu-seed layer (not shown) are formed, on which a Cu film is formed by an electroplating. Then, CMP of the Cu-film, the Cu-seed layer, a barrier metal film, and the second hardmask 8 is performed until the first hardmask 7 is exposed. As a result, as shown in FIGS. 2K and 3K, a structure in which vias 18a are buried in the via holes 11, and wirings 18b are buried in the wiring trenches 17 is obtained.

Subsequently, by repeating the similar process, a multi-layer wiring structure is obtained. Then by forming a passivation film and by forming openings used for bonding and the like, a semiconductor device is completed.

According to this embodiment, because the protection film 12 is formed using the resistmask 10 necessary to form the via holes 11, and the protection film 16 is formed using the resistmask 15 necessary to form the wiring trenches 17, it is not necessary to add new process to the conventional method. Further, because the low dielectric constant films 5 and 6 are protected by the protection films 12 and 16, the reduction in the withstand voltage is suppressed.

Figure 4A:
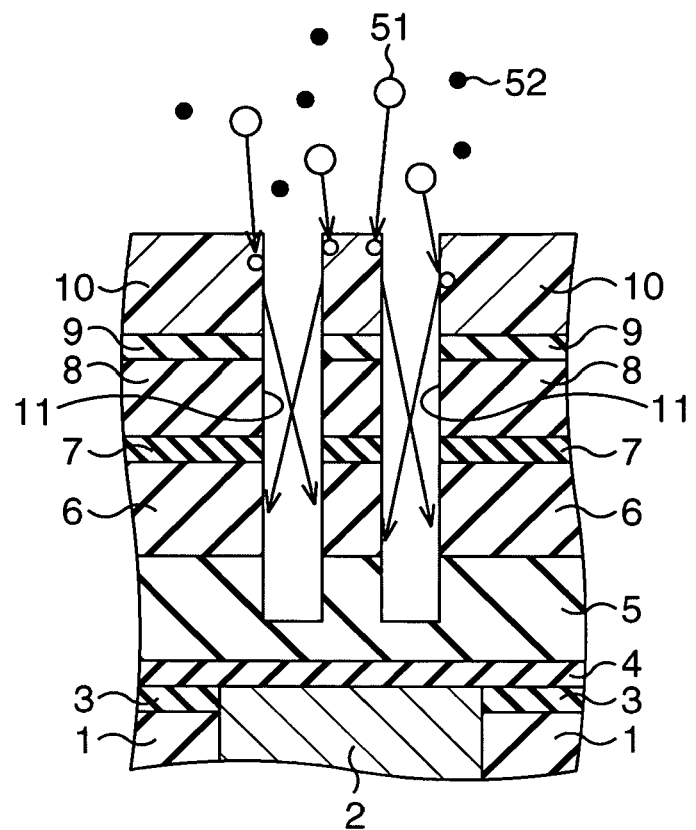
FIGS. 4A to 4C are cross sectional views showing a mechanism of a protection film 12 formation in the order of processes.
Figure 4B:
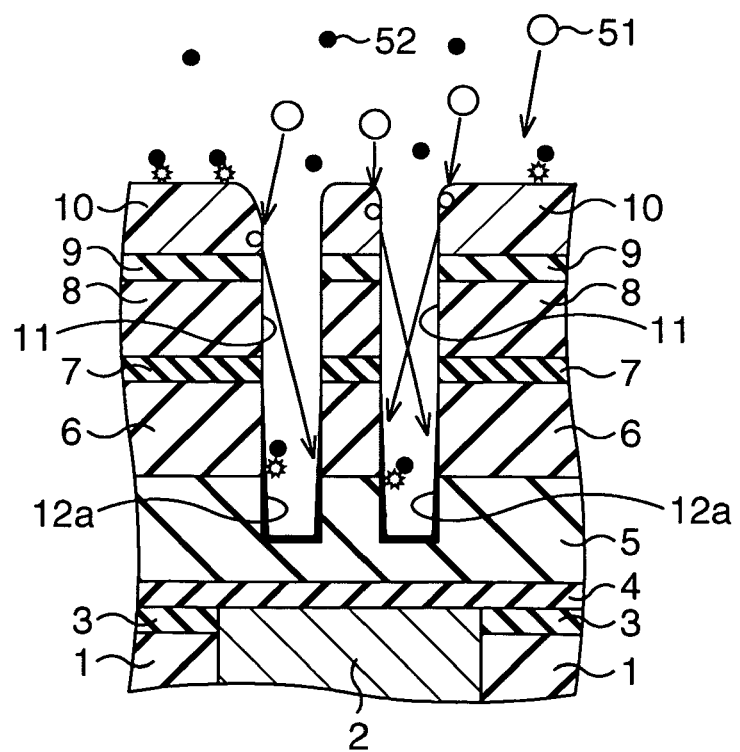
Figure 4C:
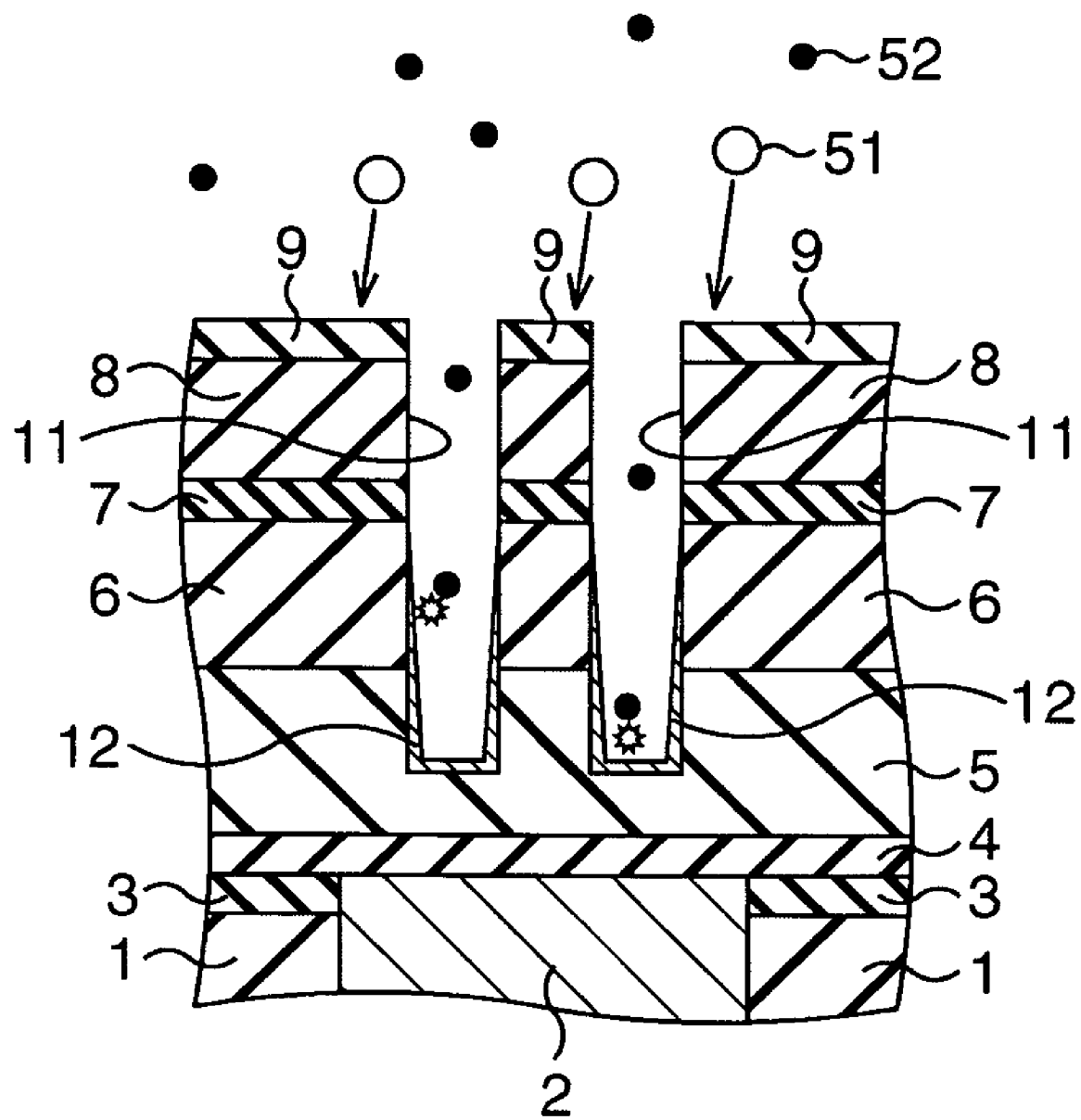

Here, a mechanism in which the protection film 12 is formed will be described. In the embodiment described above, because the substrate voltage (Vdc) is appropriately adjusted during the low pressure ashing for removing the resistmask 10, as shown in FIG. 4A, oxygen ions 51 collide with the resistmask 10 before oxygen radicals 52 reach the resistmask 10. As a result, carbon atoms and the like included in the resistmask 10 jump out by the collision energy, as shown in FIG. 4B, and they stick onto the bottom and side surfaces of the via holes 11. Consequently, even if the oxygen radicals 52 enter into the via holes 11 thereafter, the low dielectric constant films 5 and 6 are protected by an initial layer 12a of the protecting layer 12. Then as shown in FIG. 4C, the phenomenon is continued and the protection film 12 is formed until the resistmask 10 vanishes.

Figure 5A:
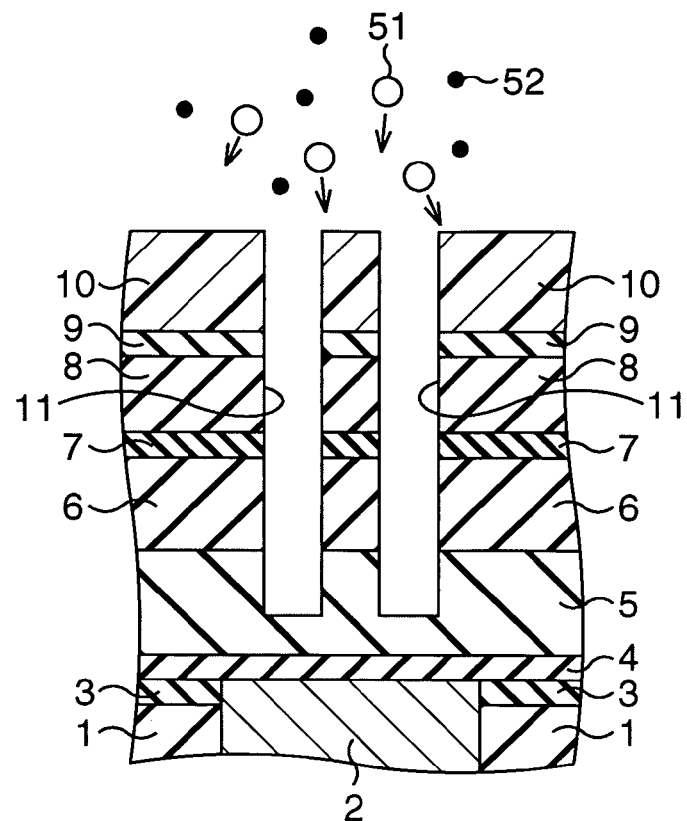
FIGS. 5A to 5C are cross sectional views showing a mechanism of damage generation in a low dielectric constant film in the order of processes.
Figure 5B:
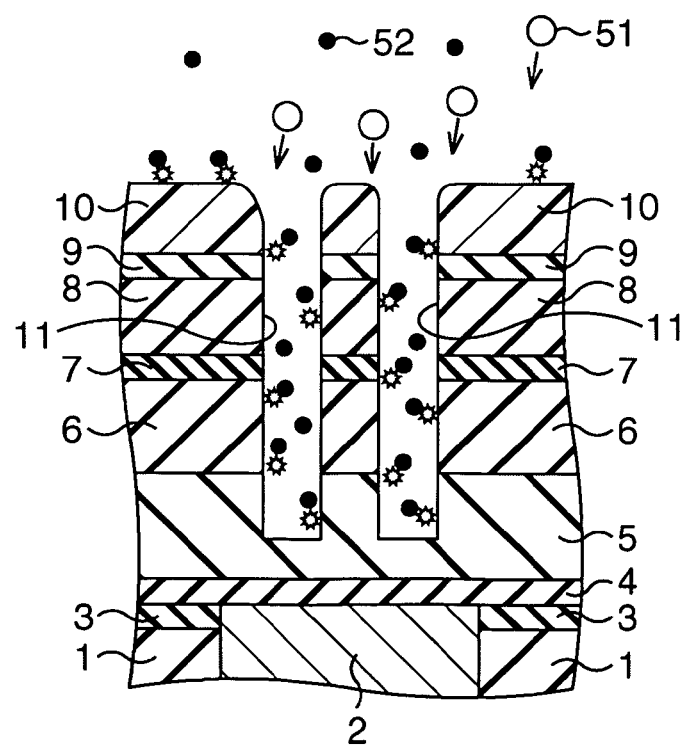
Figure 5C:
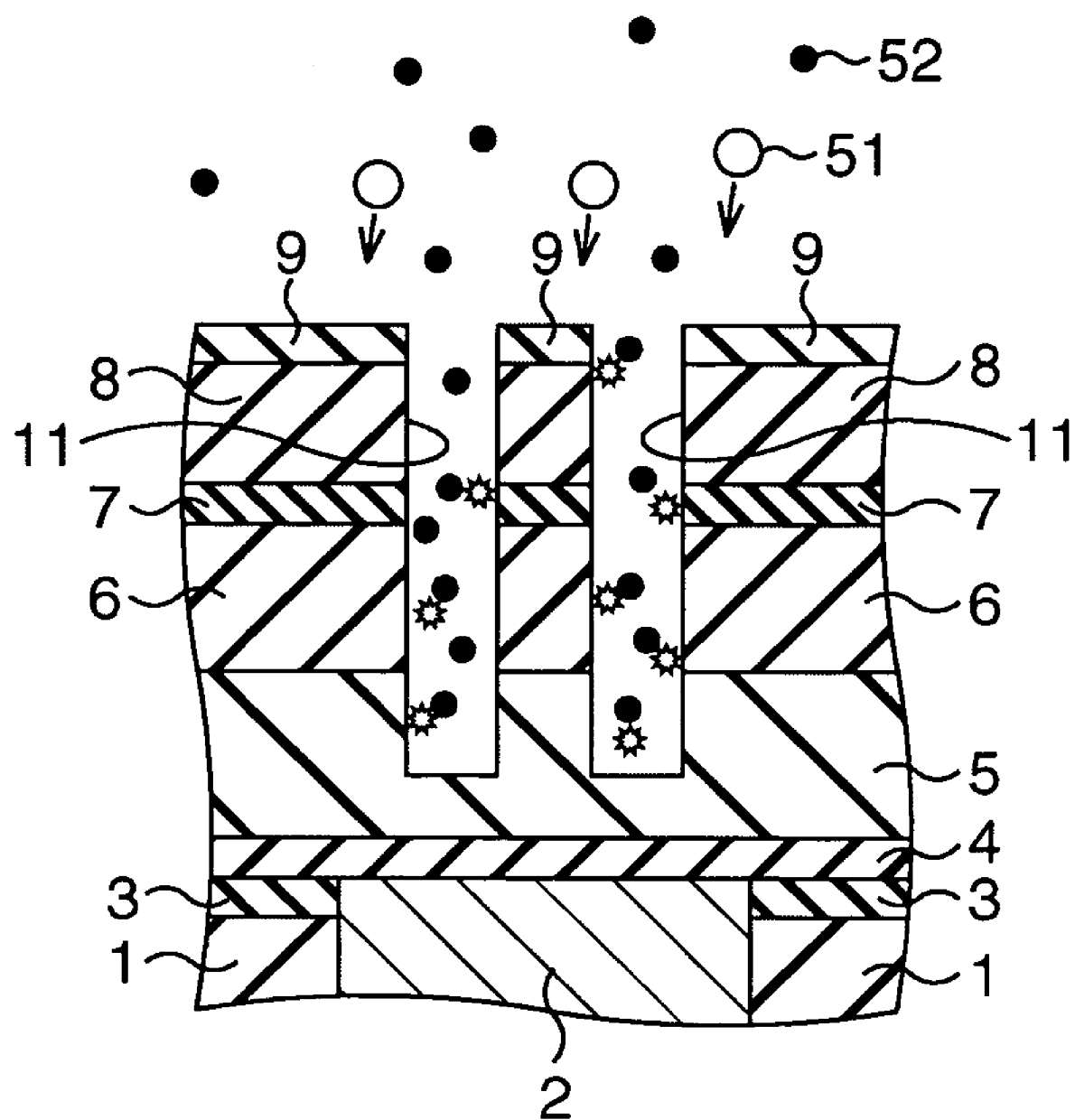

On the other hand, as for the conventional method of fabrication, when the substrate voltage (Vdc) is not appropriately adjusted during the low pressure ashing for removing the resistmask 10, as shown in FIG. 5A, oxygen ions 51 can not collide with the resistmask 10 before oxygen radicals 52 arrive at the resistmask 10. As a result, as shown in FIG. 5B, the oxygen radicals 52 enter into the via holes 11 before a protection film or its initial layer is formed in the via holes 11, so that the low dielectric constant films 5 and 6 suffer from damages. Then, as shown in FIG. 5C, the phenomenon is continued until the resistmask 10 vanishes, so that the withstand voltage of the low dielectric constant films 5 and 6 are reduced.

Figure 6:
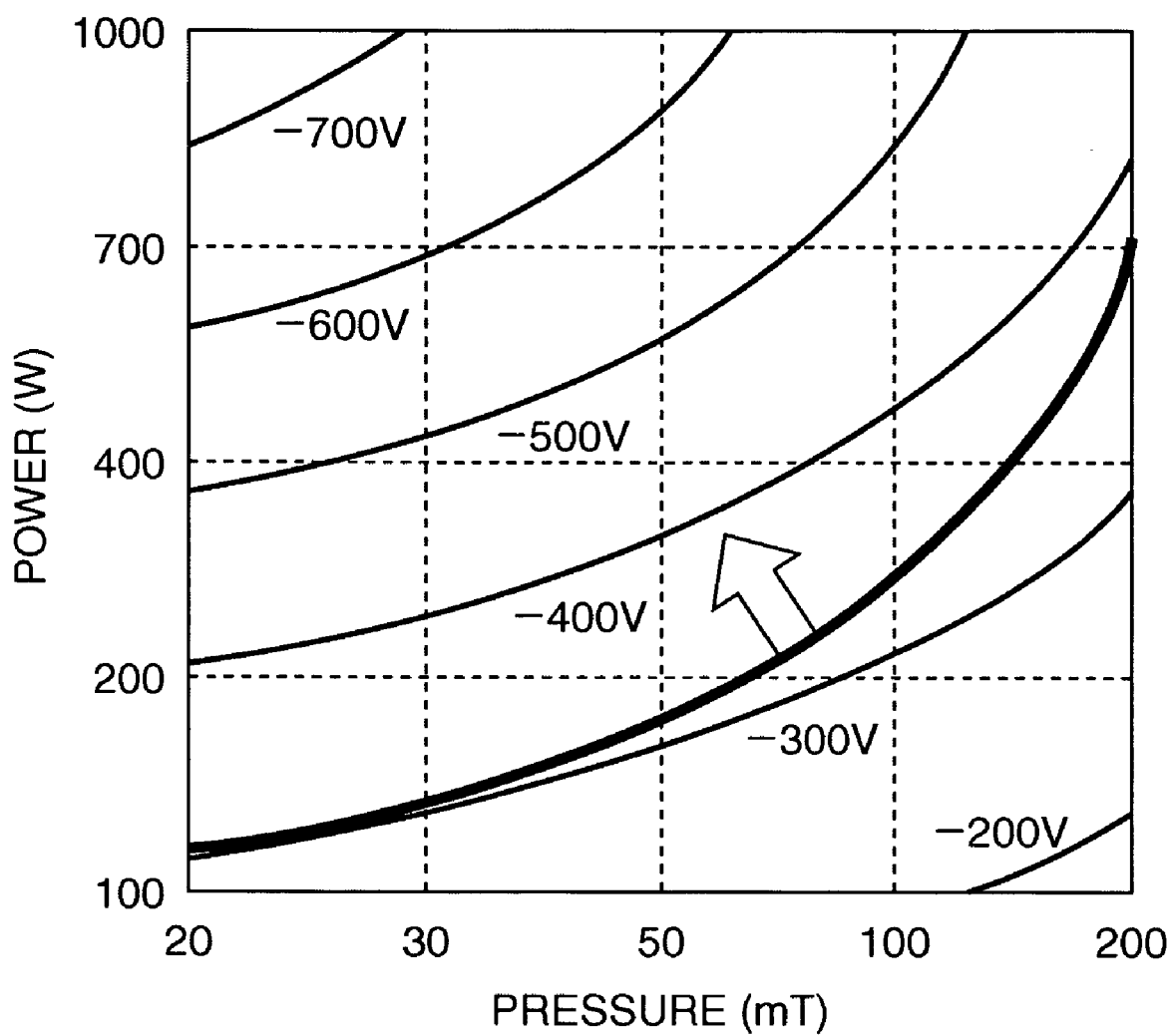
FIG. 6 is a graph showing a relation of gas pressure (vapor pressure in a chamber) and power.

Here, the condition of the ashing will be described. In the embodiment described above, the substrate voltage (substrate bias) is assumed to be −400 V when the protection film 12 or 16 is formed. This substrate voltage is the same as the voltage of the substrate when the ground voltage is taken as the reference. In a reactive ion etching (RIE) apparatus, under oxygen atmosphere, a relation as shown in FIG. 6 holds between gas pressure (pressure in the chamber) and power. That is, the more the pressure is increased, the lower the substrate voltage; the more the power is increased, the higher the substrate voltage. And, in order to form the protection film 12 or 16, when the gas pressure (pressure in the chamber) is assumed to be 2.67 Pa (20 mTorr), the substrate voltage is preferably assumed to be less than or equal to −300 V. Because it is considered that the protection film is inadequately formed just like in the conventional method of fabrication, if the substrate voltage exceeds −300 V. And, when the gas pressure is assumed to be higher than 2.67 Pa, accompanying it, as shown by the thick line and the arrow in FIG. 6, it is preferable to decrease (strengthen) the substrate voltage.

Figure 7:
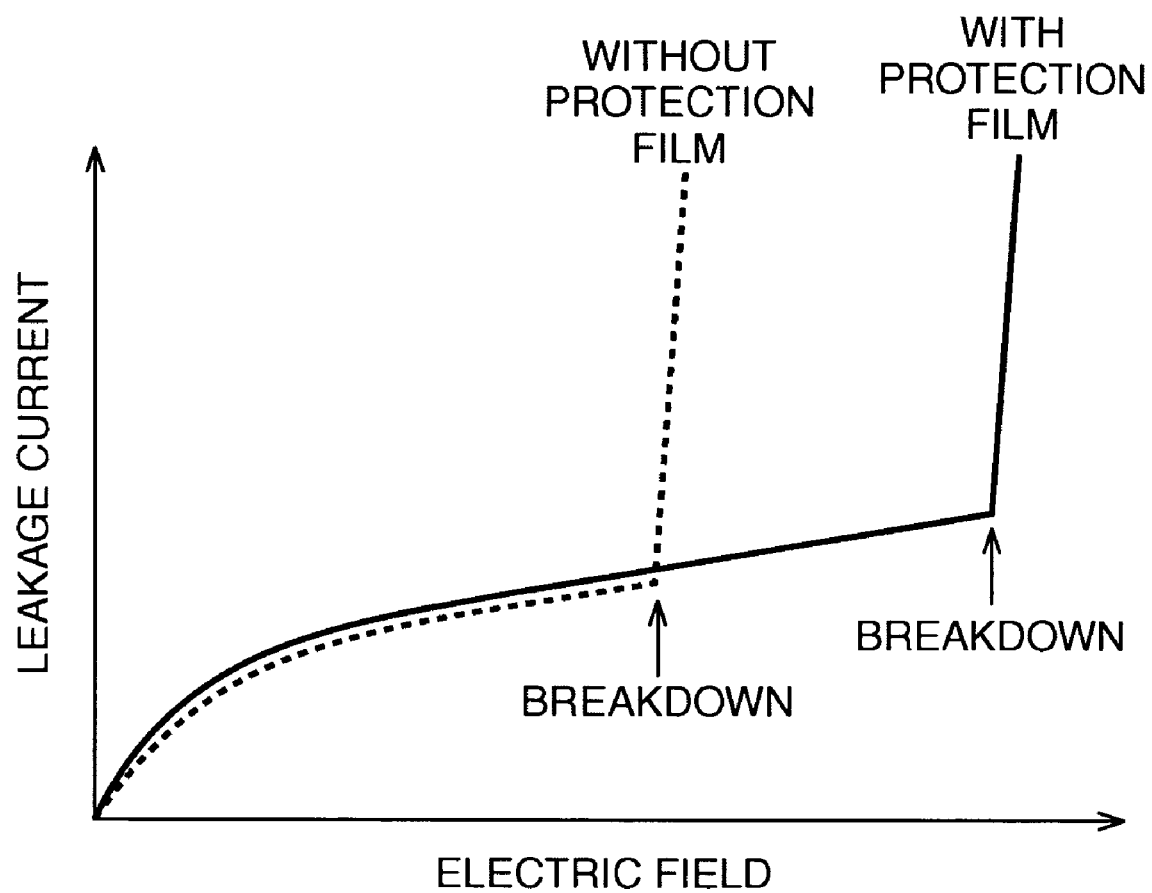
FIG. 7 is a graph showing a relation of presence or absence of a protection film and leakage current.

By forming the protection film, it is able not only to keep the withstand voltage, but also to make leakage current difficult to flow. That is, as shown in FIG. 7, when the protection film is formed, an electric field at which an insulation breakdown occurs becomes larger, and leakage current is harder to flow than when the protection film is not formed. Actually, when the inventor of this application measured, the result is obtained that the electric field at which the insulation breakdown occurs increases by about 30%.

Figure 8:
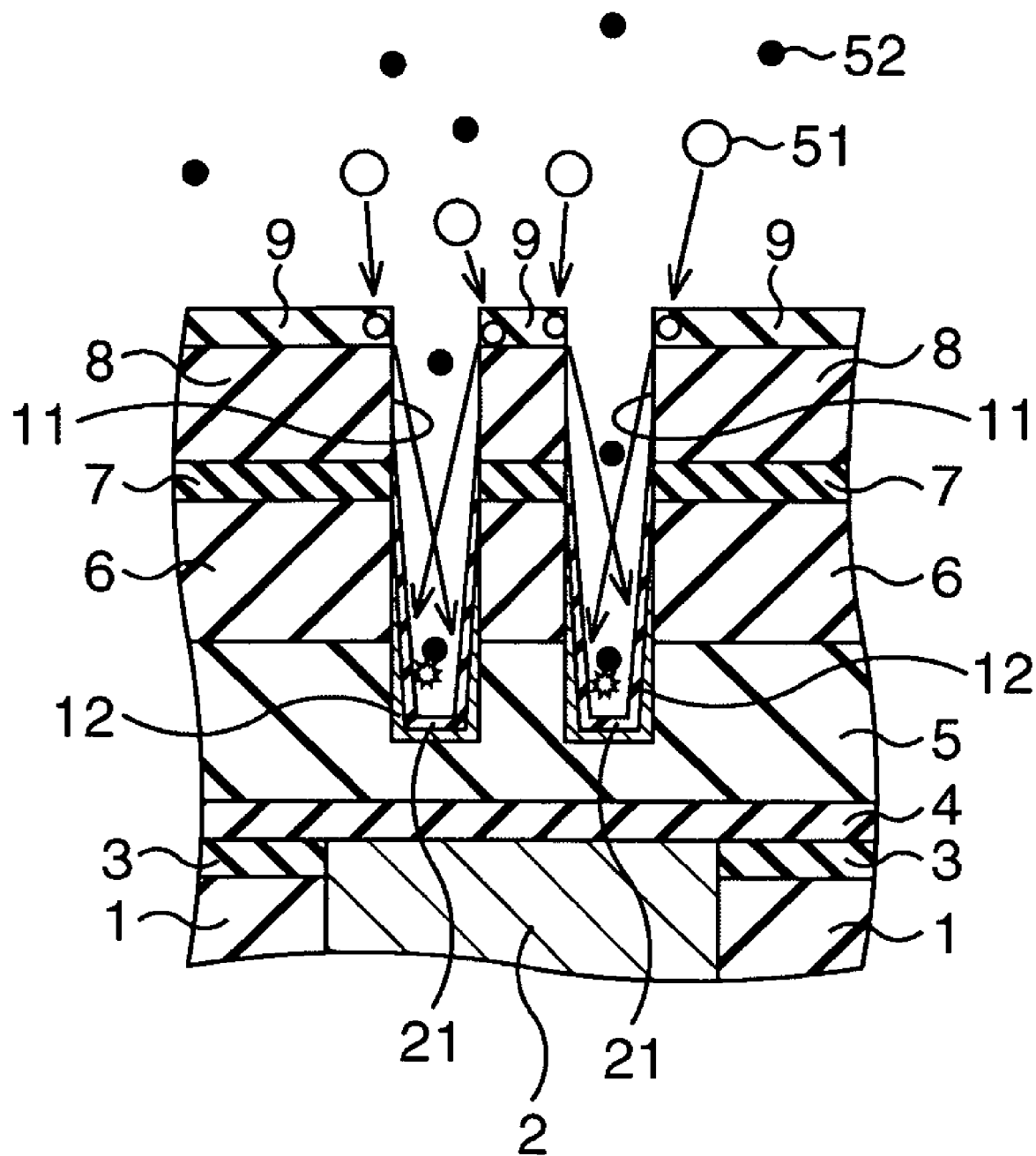
FIG. 8 is a figure showing a process of forming a protection film using a hardmask.

In the embodiment described above, though the protection films 12 and 16 are formed respectively using resistmasks 10 and 15, a protection film can be formed using the third hardmask 9. In this case, for example as shown in FIGS. 2D, 3D, and 4C, in the process when the resistmask 10 is removed by the low pressure ashing, as shown in FIG. 8, over-ashing may be performed. That is, in the embodiment described above, though the high pressure ashing is performed with decreasing the ion energy during over-ashing in order to prevent removal of the shoulder of the third hardmask 9, the low pressure ashing may be continued. In this case, as shown in FIG. 8, with the oxygen ions 51 colliding with the third hardmask 9, a part of the third hardmask 9 is sputter-etched, and a part of it sticks to the protection film 12, so that a protection film 21 is formed. As a result, the low dielectric constant films 5 and 6 are more surely protected from the oxygen radicals 52.

Figure 9:
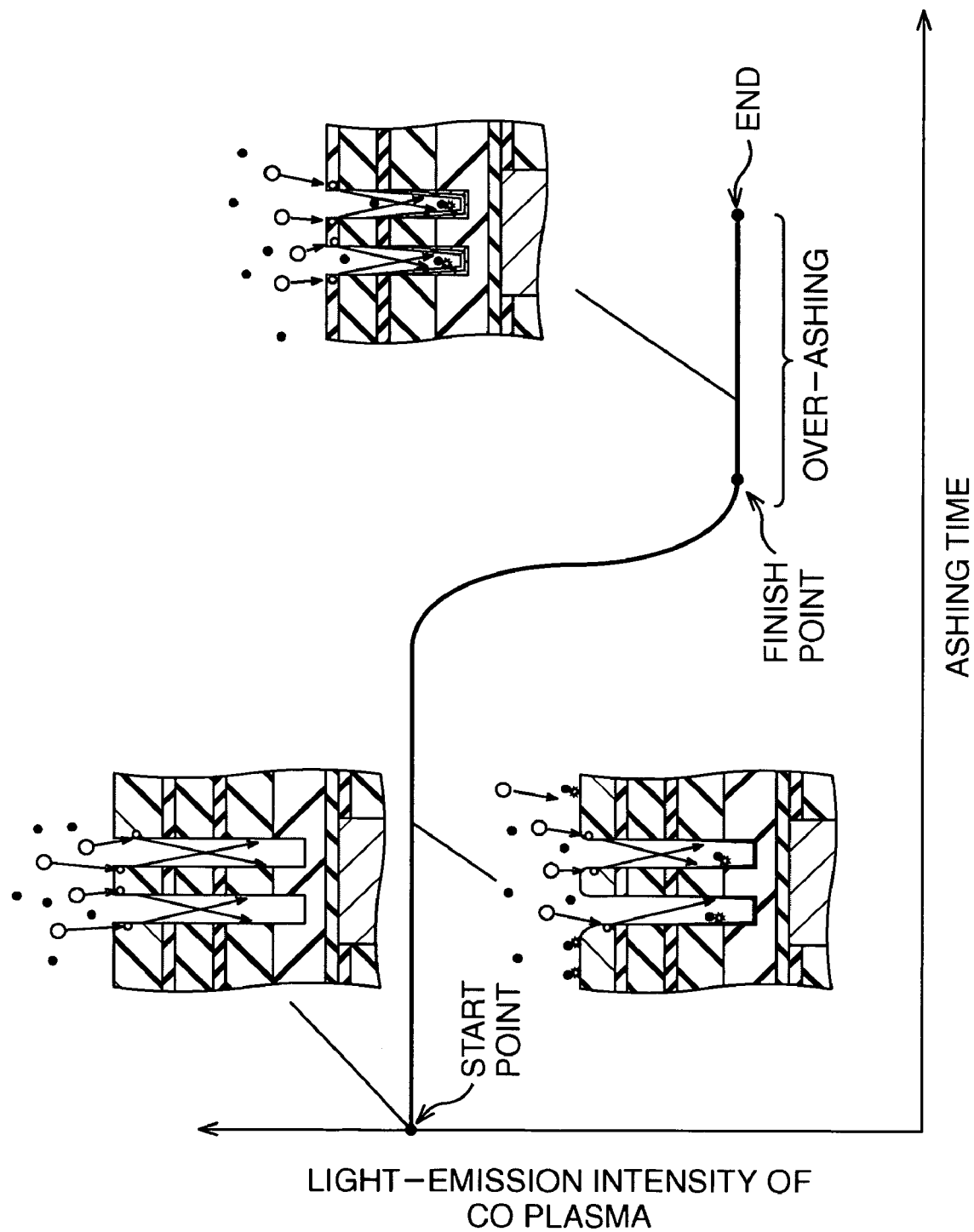
FIG. 9 is a figure showing a range of over-ashing.

In addition at the start of the ashing, as shown in FIG. 9, the collision of the oxygen ions 51 begins to generate (refer to FIG. 4A), and thereafter, the initial layer 12a is generated, the resistmask 10 becomes thinner, and more protection film 12 grows (refer to FIG. 4B). In this period, light-emission intensity of CO plasma emitted from the chamber is constant. And, when the resistmask 10 vanishes, the light-emission intensity decreases and it does not change as is. This point at which the light-emission intensity does not change is the finish point of ashing, and the ashing after this point is the over-ashing. During this over-ashing, the third hardmask 9 is sputter-etched, as also shown in FIG. 9, and the protection film 21 is formed.

In this way, the protection film 21 can be formed using the third hardmask 9. Further, instead of the protection film 12, the protection film 21 may be formed using the resistmask 10. However, in order to prevent damage at initial ashing, the protection film 12 is preferably formed.

Figure 10:
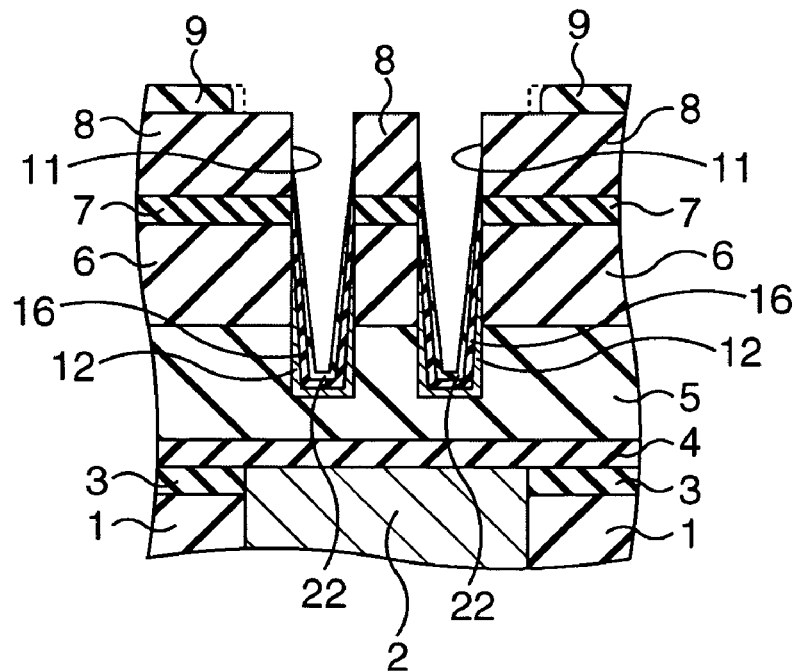
FIG. 10 is a figure showing a result of sputter-etching a hardmask when forming wiring trenches.

Further, though a protection film can be formed using the third hardmask 9 during the over-ashing of the resistmask 15, this forming of a protection film is not so preferable. Because, as shown in FIG. 10, when the over-ashing of the resistmask 15, if a protection film 22 is formed using the resistmask 15, removal of the shoulder of the third hardmask 9 occurs, and then the width and the like of the wiring trenches formed thereafter may change. Though removal of the shoulder of the third hardmask 9 occurs during forming the protection film 21, the change of the diameter of the via holes 11 is smaller influence on the characteristic than the change of the trench width, so that the range of the tolerance is wide.

Moreover, it is able to use various materials as the first hardmask 7, the second hardmask 8, and the third hardmask 9. When the third hardmask 9 is used for forming the protection film 21, as the third hardmask 9, a SiN-based film (a SiN film, a SiNH film, a SiON film, and the like), a SiC-based film (a SiC-film, a SiCH film and the like), a SiOC-based film (a SiOC film, a SiOCH film and the like), a C-based film (a C film, a CH film and the like), a Ta-based film (a Ta film, a TaN film and the like), a Ti-based film (a Ti film, a TiN film and the like) or the like is preferably formed.

Figure 11:
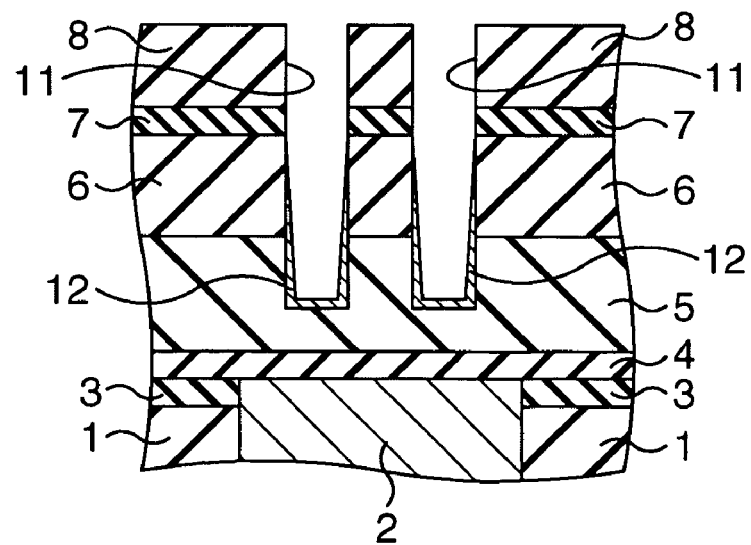
FIG. 11 is a cross section view showing a hardmask of double layer structure.
Figure 12A:
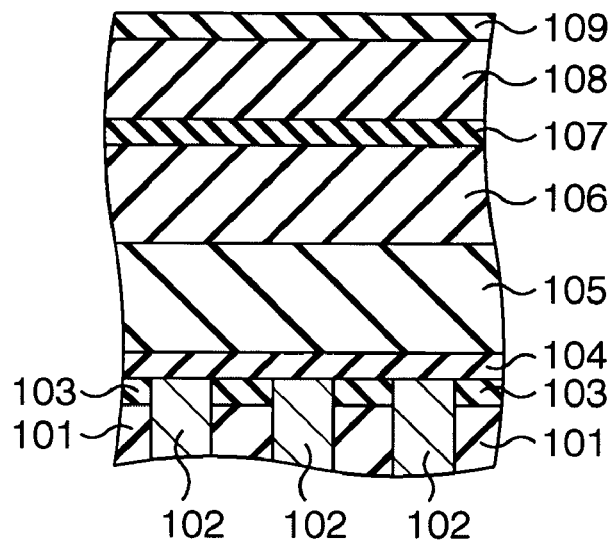
FIGS. 12A to 12J are cross sectional views showing a conventional method of fabricating a semiconductor device in the order of processes.
Figure 12B:
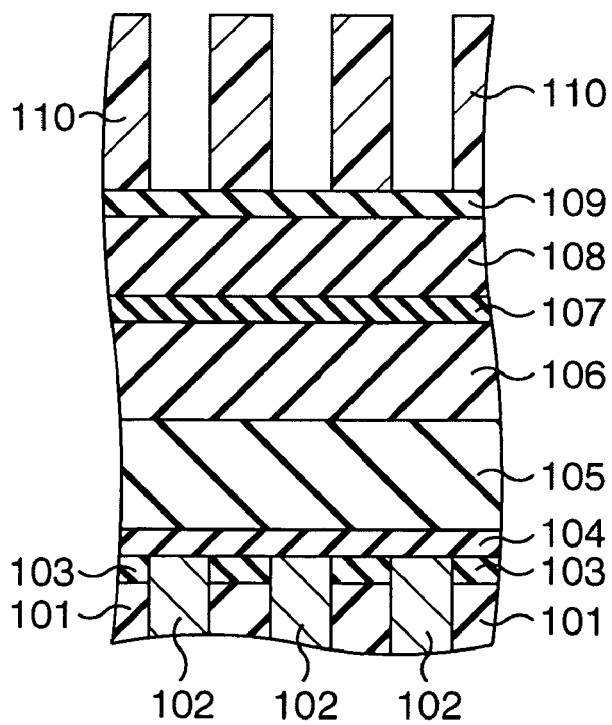
Figure 12C:
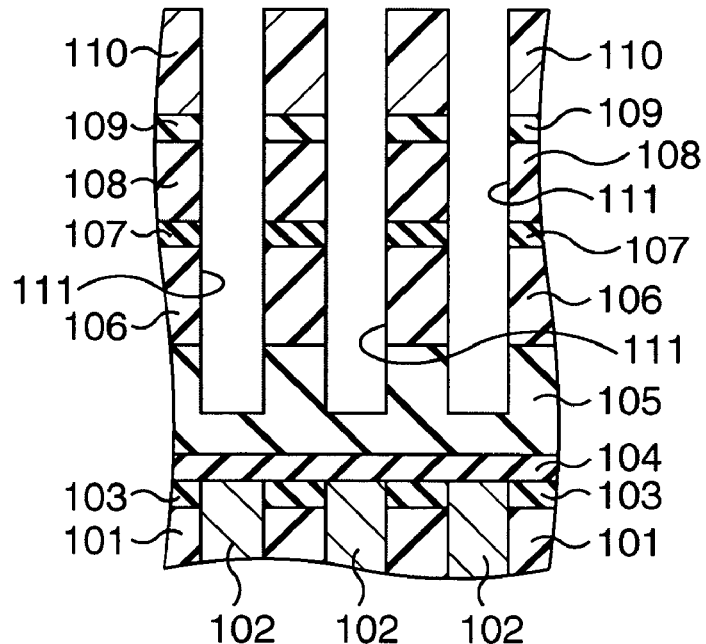
Figure 12D:
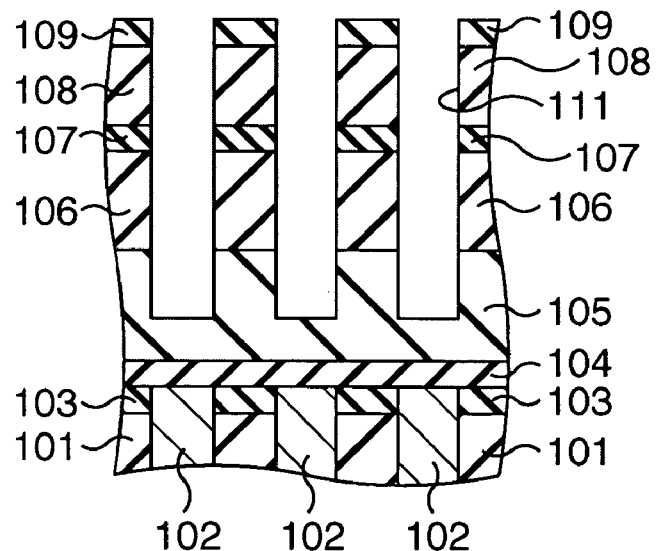
Figure 12E:
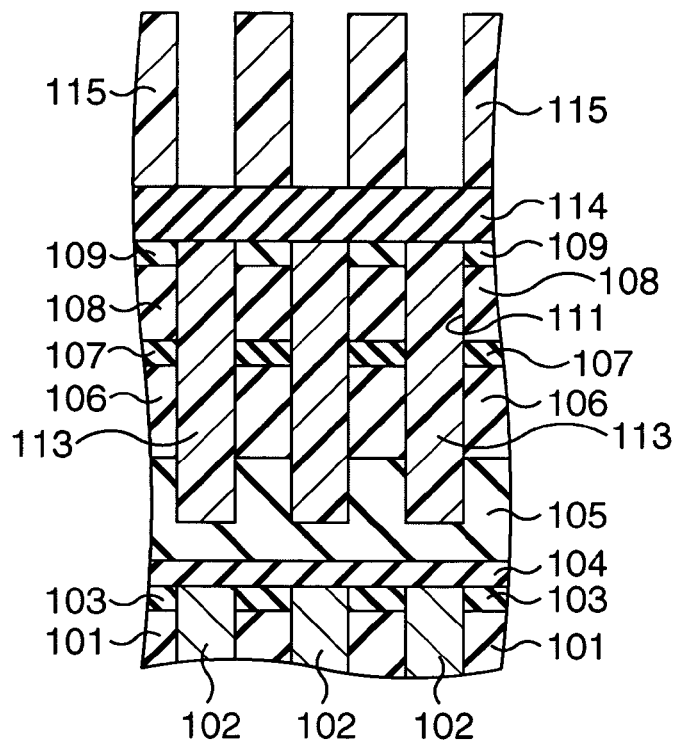
Figure 12F:
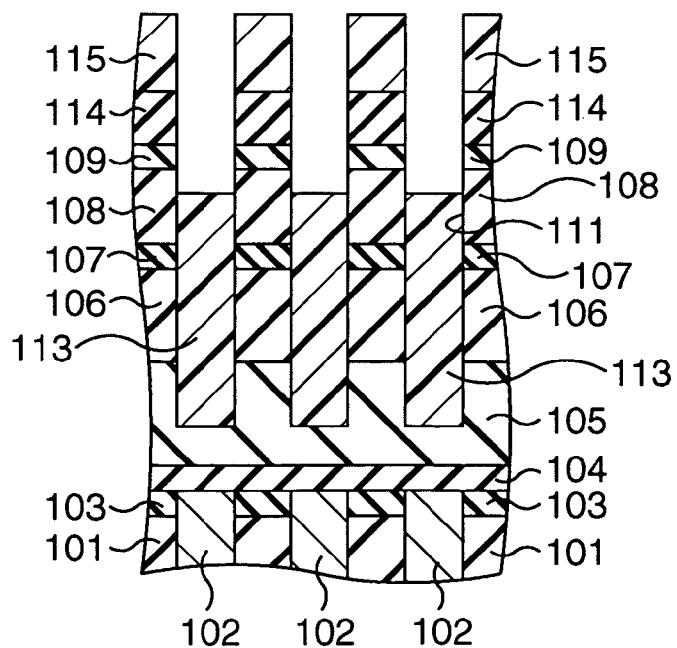
Figure 12G:
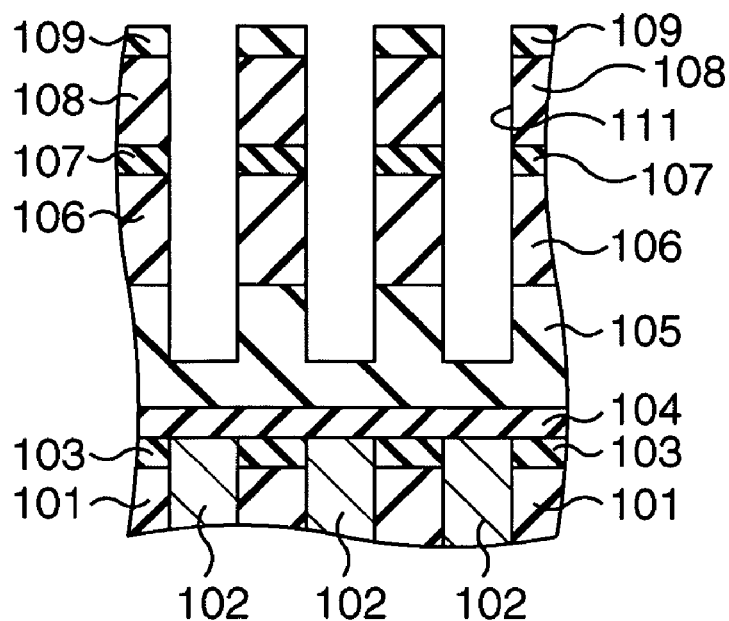
Figure 12H:
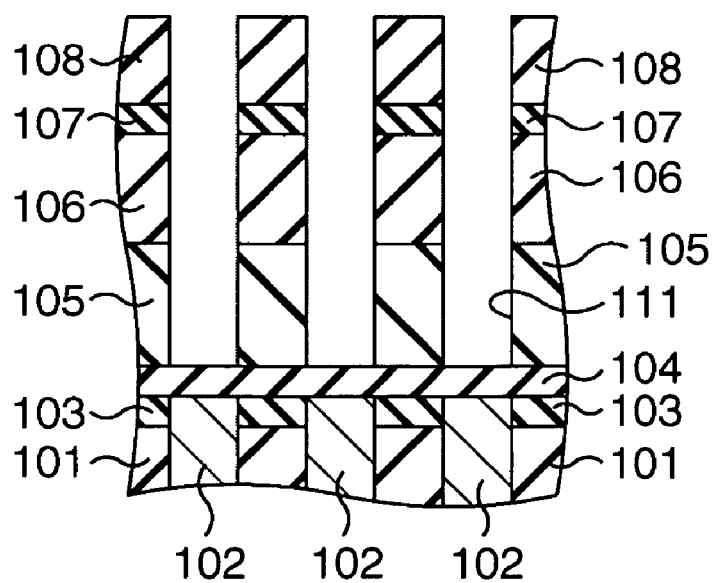
Figure 12I:
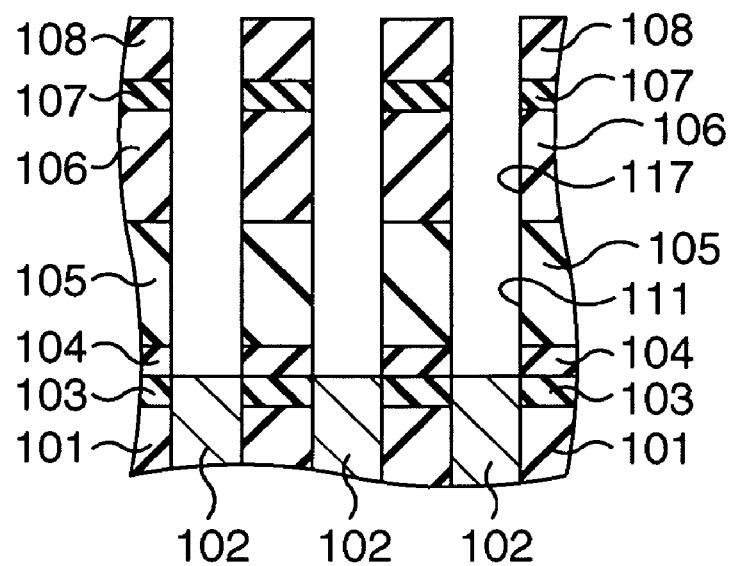
Figure 12J:
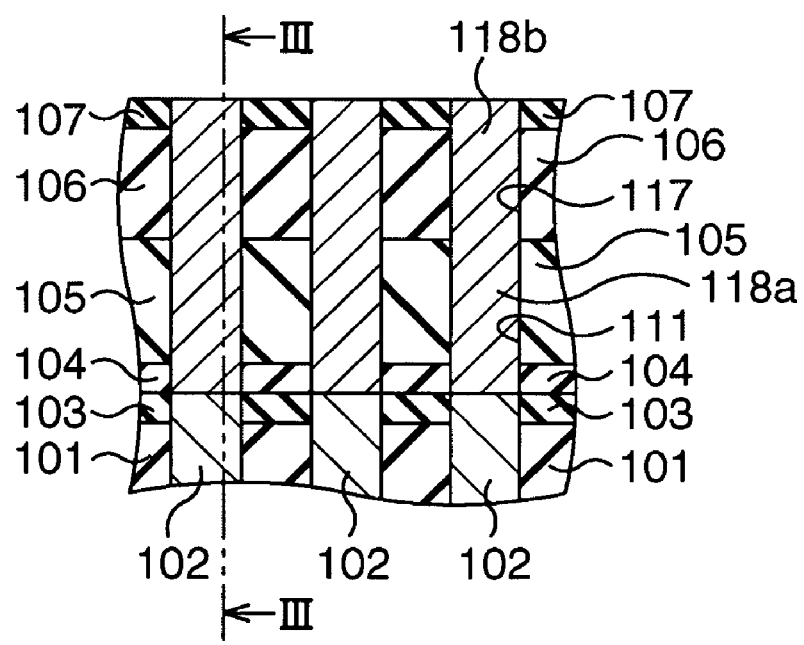
Figure 13:
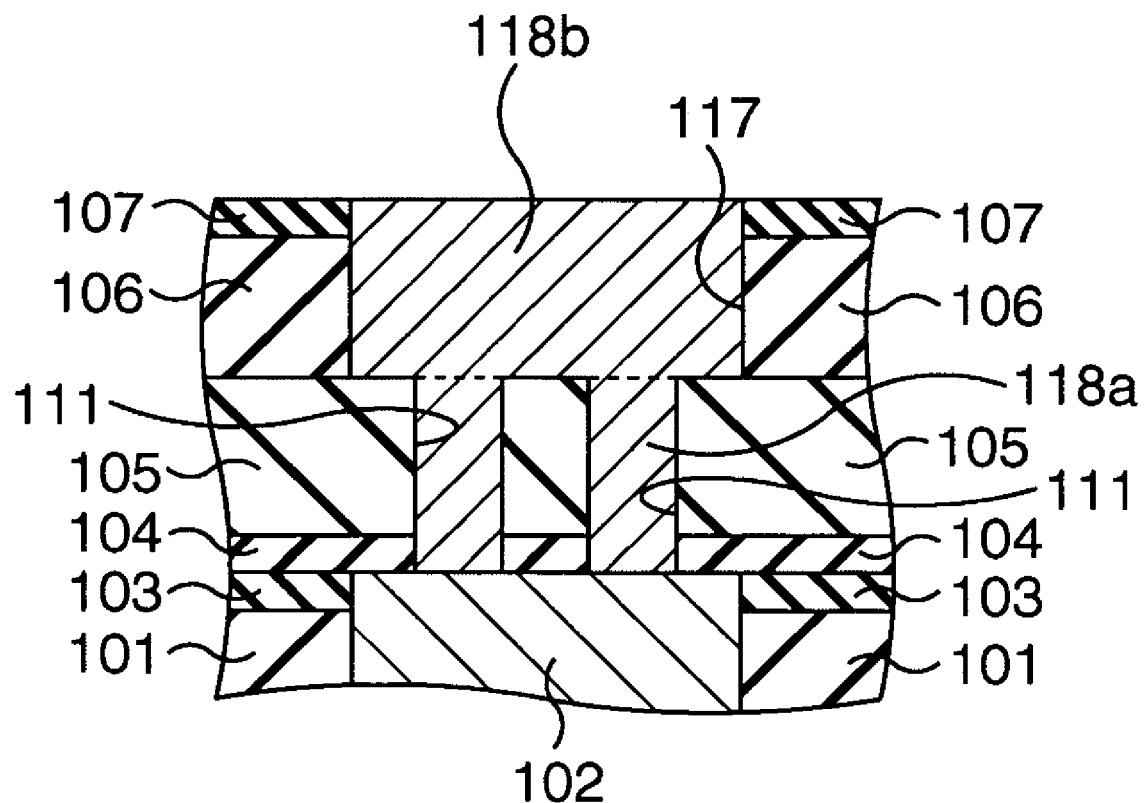
FIG. 13 is a cross section view of FIG. 12J taken along the line III-III.

In addition, though a hardmask of triple layer structure is used in the embodiment described above, a hardmask of double layer structure may be used as shown in FIG. 11. In this case also, the second hardmask 8 may be used for forming a protection film. And, when the second hardmask 8 is used for forming the protection film, as the second film 8, a SiN-based film (a SiN film, a SiNH film, a SiON film, and the like), a SiC-based film (a SiC film, a SiCH film and the like), a SiOC-based film (a SiOC film, a SiOCH film and the like), a C-based film (a C film, a CH film and the like), a Ta-based film (a Ta film, a TaN film and the like), a Ti-based film (a Ti film, a TiN film and the like) or the like is preferably formed.

Though also as the low dielectric constant films 5 and 6, various materials can be used, but a porous SiOC-based film (a SiOCH film, a SiOCN film and the like) is preferably used. Furthermore, though an interlayer insulating film is assumed to be a double layer structure, it may be assumed to be a single layer structure.

Further, though after the via holes 11 are formed the wiring trenches 17 are formed in the embodiment described above, alternatively the via holes may be formed after wiring trenches are formed. That is, in the embodiment described above, though the dual damascene of a first-via scheme is adopted, a dual damascene of a first-trench scheme may be adopted.

Further, though thickness of the protection film is not especially limited, in order to sufficiently prevent the reduction in the withstand voltage, it is preferably assumed to be more than or equal to 2 nm.

According to the present invention, because the side surface of the opening is covered with the protection film, it is able to suppress damages in the inorganic low dielectric constant film, and to prevent the reduction in the withstand voltage between vias. Furthermore, because forming the protection film is performed in parallel with the ashing of the resistmask which is also conventionally performed, the increase in the number of processes is also suppressed.

What is claimed is:

1. A method of fabricating a semiconductor device, comprising:
    forming an inorganic low dielectric constant film over a wiring;
    forming a hardmask over the inorganic low dielectric constant film;
    forming a resistmask over the hardmask;
    forming an opening in the inorganic low dielectric constant film using the resistmask;
    ashing the resistmask with forming a protection film by sticking a sputtered material generated from the resistmask at least onto a side surface of the opening by using $O_2$ plasma;
    extending the opening to the wiring; and
    burying a conductive material in the opening,
    wherein ashing the resistmask includes applying a substrate voltage of less than or equal to −300 V to a substrate above which the inorganic low dielectric constant film is formed.

2. The method of fabricating a semiconductor device according to claim 1 wherein, as the opening, a via hole in a dual damascene method is formed.

3. The method of fabricating a semiconductor device according to claim 1 wherein ashing the resistmask includes sputter-etching the resistmask.

4. The method of fabricating a semiconductor device according to claim 1 further comprising, between ashing the resistmask and extending the opening to the wiring, sticking onto the protection film a sputtered material generated from the hardmask by sputter-etching the hardmask during over-ashing the resistmask.

5. The method of fabricating a semiconductor device according to claim 1 wherein, as the hardmask, one selected from the group consisting of a SiN-based film, a SiC-based film, a SiOC-based film, a C-based film, a Ta-based film, and a Ti-based film is used.

6. The method of fabricating a semiconductor device according to claim 1 further comprising, between forming the protection film and extending the opening to the wiring:
    forming a second resistmask over the hardmask;
    patterning the hardmask using the second resistmask;
    ashing the second resistmask with sticking a sputtered material generated from the second resistmask at least onto the side surface of the opening; and
    forming a second opening in the inorganic low dielectric constant film using the hardmask.

7. The method of fabricating a semiconductor device according to claim 6 wherein, as the second opening, a wiring trench in a dual damascene method is formed.

8. A method of fabricating a semiconductor device comprising:
    forming an inorganic low dielectric constant film over a wiring;
    forming a hardmask over the inorganic low dielectric constant film;
    forming a resistmask over the hardmask;
    forming an opening in the inorganic low dielectric constant film using the resistmask;
    ashing the resistmask;
    forming a protection film by sticking a sputtered material generated from the hardmask by sputter-etching the hardmask during over-ashing the resistmask at least onto a side surface of the opening by using $O_2$ plasma;
    extending the opening to the wiring; and
    burying a conductive material in the opening,
    wherein ashing the resistmask includes applying a substrate voltage of less than or equal to −300 V to a substrate above which the inorganic low dielectric constant film is formed.

9. The method of fabricating a semiconductor device according to claim 8 wherein, as the opening, a via hole in a dual damascene method is formed.

10. The method of fabricating a semiconductor device according to claim 8 further comprising, between forming the protection film and extending the opening to the wiring:
    forming a second resistmask over the hardmask;
    patterning the hardmask using the second resistmask;
    ashing the second resistmask with sticking a sputtered material generated from the second resistmask at least onto the side surface of the opening; and
    forming a second opening in the inorganic low dielectric constant film using the hardmask.

11. The method of fabricating a semiconductor device according to claim 10 wherein, as the second opening, a wiring trench in a dual damascene method is formed.

12. The method of fabricating a semiconductor device according to claim 10 wherein, in ashing the resistmask, one selected from a group consisting of an oxygen plasma, an ammonia plasma, and a hydrogen plasma is used as an ashing plasma.

13. A method of fabricating a semiconductor device comprising:
    forming an inorganic low dielectric constant film over a wiring;
    forming a hardmask over the inorganic low dielectric constant film;
    forming a first resistmask over the hardmask;
    forming a first opening in the inorganic low dielectric constant film using the first resistmask;
    ashing the first resistmask;
    forming a second resistmask over the hardmask;
    patterning the hardmask using the second resistmask;
    ashing the second resistmask with forming a protection film by sticking a sputtered material generated from the second resistmask at least onto a side surface of the first opening by using $O_2$ plasma;
    forming a second opening in the inorganic low dielectric constant film using the hardmask;
    extending the first opening to the wiring; and
    burying a conductive material in the first and second openings,
    wherein ashing either or both of the resistmask includes applying a substrate voltage of less than or equal to −300 V to a substrate above which the inorganic low dielectric constant film is formed.

14. The method of fabricating a semiconductor device according to claim 13 wherein, as the first opening, a via hole in a dual damascene method is formed, and as the second opening, a wiring trench in the dual damascene method is formed.

15. The method of fabricating a semiconductor device according to claim 13 wherein ashing the second resistmask includes sputter-etching the second resistmask.

16. The method of fabricating a semiconductor device according to claim 13 further comprising, between ashing the second resistmask and forming the second opening, over-ashing the second resistmask on a condition where a substrate voltage applied to a substrate above which the inorganic low dielectric constant film is formed is set to be weaker than when the second resistmask is ashed.

17. The method of fabricating a semiconductor device according to claim 13 wherein, in ashing the second resistmask, one selected from a group consisting of an oxygen plasma, an ammonia plasma, and a hydrogen plasma is used as an ashing plasma.

* * * * *